US006037046A

United States Patent [19]

Joshi et al.

[11] Patent Number: 6,037,046

[45] **Date of Patent: *Mar. 14, 2000**

[54] MULTI-COMPONENT ELECTROMAGNETIC WAVE ABSORPTION PANELS

[75] Inventors: Vikram Joshi, Colorado Springs, Colo.; Kenichi Kimura, Los Angeles, Calif.; Carlos A. Paz de Araujo, Colorado Springs, Colo.; Hiroshi Kiyokawa, Yokohama, Japan

[73] Assignees: Symetrix Corporation, Colorado Springs, Calif.; Fujita Corporation, Japan

[ * ] Notice: This patent is subject to a terminal disclaimer.

[21] Appl. No.: 08/782,934

[22] Filed: Jan. 13, 1997

[51] Int. Cl.[7] .............................. B32B 7/00; H05K 9/00; H01Q 17/00

[52] U.S. Cl. .......................... 428/212; 428/325; 428/412; 428/422; 428/457; 428/702; 174/35 MS; 342/1

[58] Field of Search .................................... 174/35 R, 36, 174/35 MS; 428/77, 49, 192, 195, 213, 220, 421, 422, 457, 463, 212, 323, 325, 412, 702; 106/290, 304, 308 M; 343/872, 873; 342/1, 4, 3, 2; 252/62.9, 62.54

[56] References Cited

U.S. PATENT DOCUMENTS

| | | | |
|---|---|---|---|
| 3,568,195 | 3/1971 | Wesch et al. | 343/18 |
| 3,754,255 | 8/1973 | Suetake et al. | 343/18 A |
| 4,012,738 | 3/1977 | Wright | 343/18 A |
| 4,116,906 | 9/1978 | Ishino et al. | 260/22 A |
| 4,518,737 | 5/1985 | Traut | 524/413 |

(List continued on next page.)

FOREIGN PATENT DOCUMENTS

| | | |
|---|---|---|
| 0 353 923 A2 | 2/1990 | European Pat. Off. . |
| 0 468 887 A1 | 1/1992 | European Pat. Off. . |
| 0 473 515 A1 | 3/1992 | European Pat. Off. . |
| 0 724 309 A1 | 7/1996 | European Pat. Off. . |
| 8-18273 | 1/1996 | Japan . |

OTHER PUBLICATIONS

IEEE Transactions on Broadcasting, vol. BC–25, No. 4, Dec. 1979, Takeshi Takizawa, "Reduction of Ghost Signal by Use of Magnetic Absorbing Material on Walls," pp. 143–146 (inclusive), #XP–002063787.

Ito, et al.; Investigation on Oblique Incident Characteristics of Ferrite Absorbing Panels for TV Ghost Suppression (Source and date not given).

*Primary Examiner*—Marie Yamnitzky
*Attorney, Agent, or Firm*—Duft, Graziano & Forest, P.C.

[57] ABSTRACT

An electromagnetic wave absorption panel for use in building construction includes a protective tile layer, an absorber layer, a metal reflective layer, and a building support layer, such as concrete. The absorber layer is multi-component structure, such as: a high dielectric constant layer and ferrite layer; a ferrite layer and a low dielectric constant layer; a ferrite and a polymer; a polymer and a material having a higher dielectric constant than the polymer; a ferroelectric, a ferrite, and a polymer; a ferrite, a polymer, and a high dielectric constant material; and a high dielectric constant material, a material in which the imaginary part of the permeability is greater than or equal to the real part of the permeability, and a low dielectric constant material. The invention also includes combinations of the above, such as: a high dielectric constant material, a ferrite, and a low dielectric constant material; and multiple layers of a ferrite and a polymer. The invention further includes the above structures and combinations with specific materials, such as a ferrite, a polymer, LSM, and a high dielectric constant material; and a ferrite, a polymer, and BST. The invention also includes: a multi-component absorber element having an effective real part of the permitivity, $\epsilon'_{eff}$, and an effective real part of the permeability, $\mu'_{eff}$, such that $(\epsilon'_{eff}\mu'_{eff})^{1/2}$~1/f over said range of frequencies, where f is the frequency of the incident wave; and a multi-component absorber element having an effective real part of the permitivity, $\epsilon'_{eff}$, that decreases with frequency.

19 Claims, 13 Drawing Sheets

U.S. PATENT DOCUMENTS

| | | | |
|---|---|---|---|
| 4,929,574 | 5/1990 | Iltis et al. | 501/137 |
| 5,045,638 | 9/1991 | Wada et al. | 174/35 R |
| 5,081,455 | 1/1992 | Innui et al. | 342/1 |
| 5,296,859 | 3/1994 | Naito et al. | 342/1 |
| 5,443,746 | 8/1995 | Harris et al. | 252/62.9 |
| 5,453,328 | 9/1995 | Nagano et al. | 428/545 |
| 5,853,889 | 12/1998 | Joshi et al. | 428/411.1 |

MULTI-COMPONENT ELECTROMAGNETIC WAVE ABSORPTION PANELS

BACKGROUND OF THE INVENTION

1. Field of the Invention

The invention relates to panels utilized in construction of buildings for the purpose of absorbing electromagnetic waves, particularly in the frequency ranges of radio transmissions, television transmissions, and microwaves, and more particularly to such panels made up of two or more distinct materials, such as composites and multi-layered panels.

2. Statement of the Problem

For many years it has been recognized that reflection of electromagnetic waves from buildings and other structures causes problems, such as ghosts in television reception and static and noise in radio reception. This is a particularly significant problem in densely populated high technology societies, such as the large cities of the United States, Europe and Japan. In Japan, for example, in large cities a broadcast television electromagnetic impact statement is required before a large building may be constructed, and construction codes may require that buildings be constructed to avoid reflections of electromagnetic waves in the frequency range of radio, television and some microwaves, i.e. between 80 to 2400 megahertz. Transmission of electromagnetic waves through many building materials also has in some situations created problems of secrecy. For these reasons, extensive research has been performed to find building materials that will absorb electromagnetic radiation. See, for example, *Investigation on Oblique Incident Charactenistics of Ferrite Absorbing Panels For TV Ghost Suppression,* Hironobu Ito et al. Japan Broadcasting Corporation et al. (about 1994). Wave absorption panels for use in building construction generally comprise a support layer of concrete or other basic building material, a reflective layer that is usually a metal mesh or other conductive material, an absorbing layer that typically is a ferrite, and an external layer, such as a silicate building tile, to protect the absorbing layer from environmental effects. Other materials that have been used as an absorbing layer include conducting materials, such as carbon fibers, in a resin.

Since nearly all matter has a characteristic frequency at which it absorbs radiation, it is relatively easy to find a material that will absorb electromagnetic radiation over some narrow frequency ranges. For example, ferrites typically have an absorption peak roughly between 200 megahertz to 400 megahertz. It is much more difficult, if not impossible, to find a material that will absorb over a broad frequency range of several thousand megahertz, or even just a few hundred megahertz. Thus, multilayered structures comprising combinations of ferrites, conducting fibers in a resin, and other similar structures have been tried as wave absorbers.

It is known to use a quarter-wave plate to provide an electromagnetic wave absorber. In such an absorber, a thickness of material equal to one-quarter of a wavelength is placed in front of a 100% reflector, such as a metal layer. This absorption principal has not, up to now, been applied in attempting to make absorption panels for buildings because waves in the television frequency range are many meters long. Thus, such an absorber that is a few meters long would be excessively thick for use in a building.

The most successful materials for wave absorption panels, ferrites, are relatively heavy, must be up to a centimeter thick to be effective, and are relatively soft and therefore require an additional layer of building material, such as tiles, to protect them from the environmental effects. Thus, wave absorption panels known in the art are bulky and heavy, making the structure expensive and unwieldy to employ on an entire building, are not capable of absorbing over the wide frequency range necessary to include all electromagnetic waves commonly present in a large metropolitan area, or both. Moreover, the frequency at which conventional ferrites absorb is in the 200–400 megahertz range, while VHF television frequencies range from about 100 to 250 megahertz and UHF television frequencies range from about 450 megahertz up to about 800 megahertz. Therefore, it would be highly desirable to have a wave absorption panel that is relatively light and thin while at the same time absorbs over a wide frequency range including up to about 800 megahertz.

The prior art wave absorption panels generally are useful only in the frequency range of television electromagnetic waves, which are the waves in which the problems due to reflection are most widespread. However, problems with reflection of waves can have serious consequences in other specialized areas, such as radio LAN systems, which can lose data because of reflections, and airport radio control systems, in which clarity of signal can be a matter of life and death. It would be very desirable to have absorption panels that absorb strongly in the frequency ranges of these specialized uses.

It has also been found that, in practice, due to the proximity to electromagnetic wave sources of a narrow frequency, many construction sites have a negative impact on the electromagnetic environment only in a narrow frequency range. This range cannot be predicted in advance of knowing the location of a building to be constructed. Therefore, it would be highly useful to have an absorber panel and process of fabrication of absorber panels that are easily tuned to a specific frequency.

SUMMARY OF THE INVENTION

The invention solves the above problems by providing multi-component absorbers that can be tuned to cover a wide frequency range, or to have superb absorption in a specific range, depending on the electromagnetic environmental problem defined by a specific construction site. The tuning may be done by selecting the specific materials in a multi-layer stack, by selecting specific materials in a composite, by varying the thickness of the layers in a multi-layer stack or the thickness of a composite, by varying the amounts of each component in a composite, and by combinations of the foregoing.

The invention provides specific combinations of materials that lend themselves to the solution of the broad range problem, or to tuning for the solution to specific problems. For example, the invention provides a combination of a high dielectric material with a ferrite that is a highly effective absorber over a moderate range of television frequencies and can be tuned to a specific range by choosing the specific materials and by varying the thickness of each component layer. As another example, a combination of a ferroelectric layer, a ferrite layer, a polymer, and a reflective metal provides excellent absorption across the entire television frequency range. As a further example, the combination of a first ferrite layer and a second ferrite layer can be tuned to a particular frequency with little change in the magnitude of the reflective loss as the frequency range over which the loss occurs is changed.

The invention provides an electromagnetic wave absorption panel for use in building construction, the absorption panel comprising: a building support element; and an absorber element supported by the support element, the absorber element comprising a first layer and a second layer, the first layer located closer to the point of incidence of the electromagnetic wave on the panel, the first layer comprising a high dielectric constant material, and the second layer comprising a ferrite. Preferably, the absorber element further includes a third layer located more distant from the point of incidence of the electromagnetic wave than the second layer, the third layer comprising a low dielectric constant material. Preferably, the low dielectric constant material comprises a polymer and the high dielectric constant material comprises a ferroelectric material, and the panel further including a conductive reflective element located farther from the point of incidence of the electromagnetic wave than the absorber element.

In another aspect, the invention provides an electromagnetic wave absorption panel for use in building construction, the panel comprising: a building support element; and an absorber element supported by the support element, the absorber element comprising a first layer and a second layer, the first layer located closer to the point of incidence of the electromagnetic wave on the panel than the second layer, the first layer comprising a ferrite, and the second layer comprising a high dielectric constant material. Preferably, the ferrite comprises nickel-zinc ferrite and the high dielectric constant material comprises BST. Preferably, the absorber element further includes: a third layer located between the first layer and the second layer, the third layer comprising a polymer; and a fourth layer located between the third layer and the second layer, the fourth layer comprising LSM. Preferably, the absorber element further includes a third layer located farther from the point of incidence of the electromagnetic wave than the first layer, the third layer comprising a low dielectric constant material. Preferably, the third layer is located between the first layer and the second layer, and the panel further including a conductive reflective element located farther from the point of incidence of the electromagnetic wave than the absorber element. Preferably, the absorber element further includes a fourth layer comprising a dielectric material.

In another aspect the invention provides an electromagnetic wave absorption panel for use in building construction, the panel comprising: a building support element; and an absorber element supported by the support element, the absorber element comprising a first layer and a second layer, the second layer located farther from the point of incidence of the electromagnetic wave on the panel than the first layer, the first layer comprising a ferroelectric material, and the second layer comprising a ferrite. Preferably, the absorber element further includes a third layer located farther from the point of incidence of the electromagnetic wave than the second layer.

In a further aspect the invention provides an electromagnetic wave absorption panel for use in building construction, the panel comprising: a building support element; and an absorber element supported by the support element, the absorber element comprising a first layer and the second layer, the second layer located farther from the point of incidence of the electromagnetic wave on the panel than the first layer, the first layer comprising a ferrite, and the second layer comprising a ferroelectric material.

In yet another aspect the invention provides an electromagnetic wave absorption panel for use in building construction, the panel comprising: a building support element; and an absorber element supported by the support element, the absorber element comprising a first layer comprising a polymer and a second layer comprising a material having a higher dielectric constant than the polymer. Preferably, the second layer is located farther from the point of incidence of the electromagnetic wave on the panel than the first layer. Alternatively, the first layer is located farther from the point of incidence of the electromagnetic wave than the second layer. Preferably, the second layer comprises a ferrite and there are n of the absorber elements, each absorber element comprising one of the first layers and one of the second layers, and where n is an integer between 2 and 100.

In still another aspect the invention provides an electromagnetic wave absorption panel for use in building construction, the panel comprising: a building support element; a reflective element supported by the support element; and an absorber element supported by the support element, the absorber element located closer to the point of incidence of the electromagnetic wave on the panel than the reflective element, the absorber element comprising a first layer comprising a ferrite and a second layer comprising a low dielectric constant material, the second layer located farther from the point of incidence of the electromagnetic wave than the first layer. Preferably, there are n of the absorber elements, each absorber element comprising one of the first layers and one of the second layers, and n is an integer between 2 and 100.

The invention also provides an electromagnetic wave absorption panel for use in building construction, the panel comprising: a building support element; and an absorber element supported by the support element, the absorber element comprising a first layer comprising a high dielectric constant material, a second layer comprising a material in which the imaginary part of the permeability is greater than or equal to the real part of the permeability, and a third layer comprising a low dielectric constant material, the third layer located farther from the point of incidence of the electromagnetic wave on the panel than the first layer, the second layer located between the first layer and the third layer. Preferably, the second layer comprises a ferrite and the panel further includes a conductive reflective element located farther from the point of incidence of the electromagnetic wave than the absorber element. Preferably, the third layer comprises a polymer, and the first layer comprises a material selected from the group consisting of $ABO_3$ type perovskites and layered superlattice materials.

In addition, the invention provides an electromagnetic wave absorption panel for use in building construction, the absorption panel capable of effective wave absorption over a range of frequencies, the absorption panel comprising a multi-component absorber element having an effective real part of the permittivity, $\epsilon'_{eff}$, and an effective real part of the permeability, $\mu'_{eff}$, such that $(\epsilon'_{eff}\mu'_{eff})^{1/2}\sim 1/f$ over the range of frequencies, where f is the frequency of the incident wave.

In a further aspect the invention provides an electromagnetic wave absorption panel for use in building construction, the absorption panel capable of effective wave absorption over a range of frequencies, the absorption panel comprising a multicomponent absorber element having an effective real part of the permittivity, $\epsilon'_{eff}$, that decreases with frequency.

The invention not only provides new multi-component structures for wave absorption panels which are lighter, less bulk, and absorb over wider frequency ranges than previous structures used for wave absorption in building construction, but a study of these structures has led to a deeper understanding of how the waves are absorbed, such as the role that dielectric constant can play in absorption panels, and it also has led to a process of designing a panel by first finding a structure that absorbs roughly in the region where absorption is desired, and then tuning the composition of the absorber to provide a dielectric constant and other parameters that will more closely correspond to a quarter-wave plate, and tuning the thickness of the materials to move the absorption band to cover the desired frequency range. Numerous other features, objects and advantages of the invention will become apparent from the following description when read in conjunction with the accompanying drawings.

DETAILED DESCRIPTION OF THE PREFERRED EMBODIMENT

Figure 1:
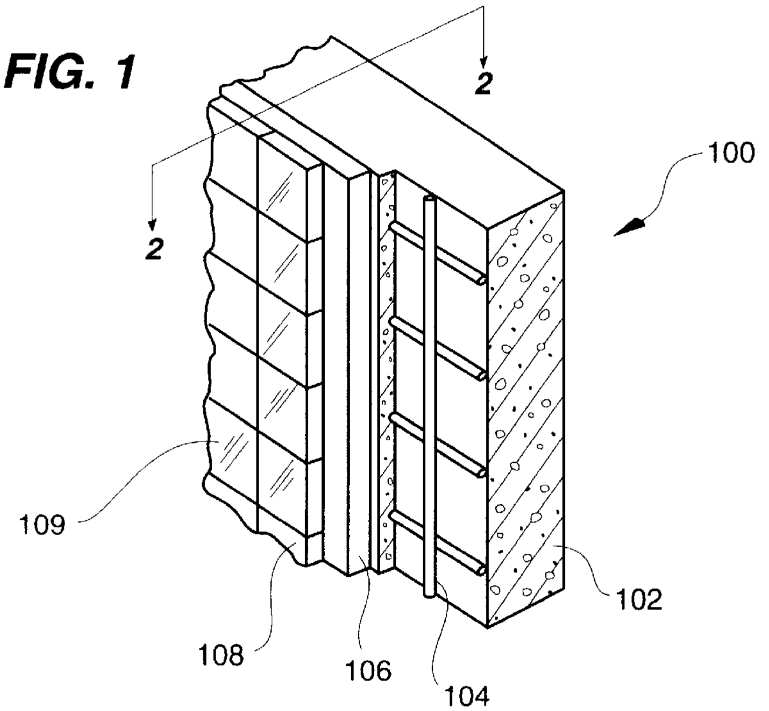
FIG. 1 shows a perspective, partially cut-away view of a generalized wave absorption panel according to the invention.
Figure 2:
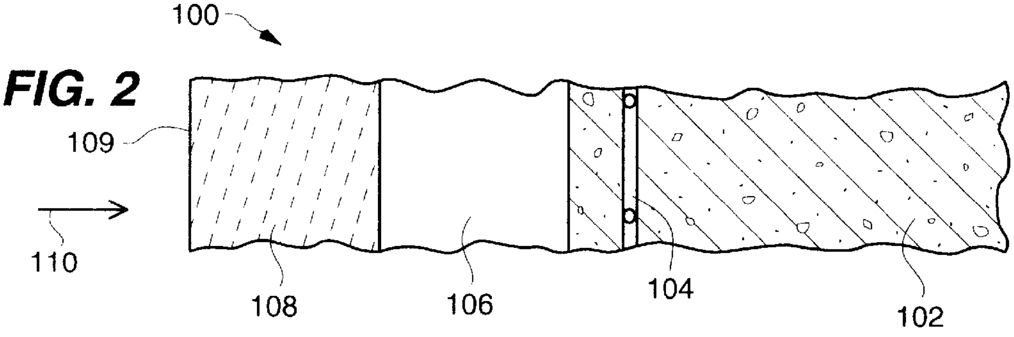
FIG. 2 shows a cross sectional view of the wave absorption panel according to the invention taken through the line 2–2 of FIG. 1.

FIGS. 1 and 2 show a generalized wave absorption panel according to the invention. A perspective, partially cut-away view is shown in FIG. 1, and a cross-sectional view is shown in FIG. 2. First of all, it should be understood that FIGS. 1 and 2 and the other figures that depict cross-sections of an absorber 106 according to the invention do not depict actual panels or absorbers, but are simplified representations designed to more clearly depict the invention than would be possible from a drawing of an actual panel. For example, some layers are so thin as compared to other layers, that if all layers were depicted in correct relative thicknesses, many figures would be too large to fit on a single page. The panel 100 includes four principal elements: a support element 102, a reflective element 104, an absorber element 106, and an external protective element 108. Preferably, each of elements 102, 104, 106, and 108 comprise a layer of material, with the layers substantially parallel to one another. The support element 102 is made of a building structural material, such as concrete. The reflective layer 104 is generally a layer of a conductive material, such as a metal. In the preferred embodiment it is a layer of iron mesh or an iron grid, 104, that is imbedded in the concrete 102 and also serves to strengthen the concrete, as is known in the concrete art. Generally, mesh 104 is buried 1 to five inches deep within concrete 102. Since the electromagnetic waves that are to be absorbed are of the order of a meter to hundreds of meters in length, they "see" the mesh as essentially solid and are reflected. The absorber element 106 is shown only generally in FIGS. 1 and 2. The preferred embodiments of this layer 106 will be described in detail below. As will be seen, each embodiment of absorber 106 includes multi-components, either in the sense of including two distinct material components, such as a polymer and second material as in a polymer-ceramic composite, or in the sense of including two or more distinct layers of distinct materials. From the above, it should be understood that the term "multi-component" in this disclosure does not include a single chemical compound, even if the compound contains more than one element. Protective element 108 is generally made of a conventional building material, such as a silicon-based tile that may also be decorative in nature as well as being resistant to weather. An important feature of the invention is that in some embodiments, protective tile element 108 is optional, or from another aspect, forms part of absorber element 106. That is, some of the absorptive materials of the invention, such as the high dielectric constant materials (see below), are also ceramics or other hardened materials that are highly weather resistant. Reflective element 104 is also optional. In some cases, it may be incorporated into a support element 102 that is thick enough to stop all radiation from passing through. In certain cases, support element 102 may be the same as absorber element

106, when this element is strong enough to provide the support necessary for the wall or other structure of which it is a part. Although the preferred embodiments will generally be on concrete or other buildings in which reflective element 104 is an integral part, in some applications, a reflective element may not be desirable if reflections are to be kept to a minimum. That is, in some cases, the ghost problem may be solvable only by not creating reflections at all. In the embodiments discussed below, the reflective element 104 is present, unless specified otherwise. Since the invention particularly involves the materials and structure of the absorptive element 106, we shall focus on this element in the remainder of this disclosure. In FIG. 2 and each embodiment of absorber 106 shown below, the radiation 110 is incident from the left of the figure. This is important because the order of the absorptive multi-layers from the point 109 of incidence of the radiation 110 is significant to yield the optimum absorption.

The fact that it is difficult to build and test absorber panels 100 has been a significant obstacle to progress in this art. Test panels 100 are bulky and not easy to fabricate in many different configurations. Further, it is difficult to create a test structure that will satisfactorily test the samples. This has been overcome in the present disclosure by creating a complex computer system capable of simulating various panel 100 configurations. Many actual embodiments of the panel 100 were built and compared to the results of the computer simulation system to assist in perfecting the simulation system. In the discussion below, the measurements given are from actual samples made as discussed below, unless it is specifically noted that the measurements are from the computer simulation system.

Figure 3:
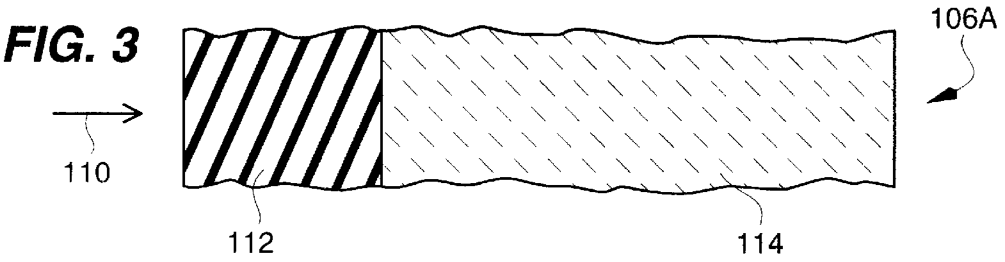
FIG. 3 shows a cross-sectional view of a preferred embodiment of the wave absorbing layer of the panel of FIG. 1.

FIG. 3 shows a cross-sectional view of a preferred embodiment of absorber element 106A according to the invention. In the actual fabrication and testing of absorber 106, both for the embodiment 106A of FIG. 3 and the other actually fabricated embodiments discussed below, the absorber was fabricated by a process discussed below, and mounted on a metal support in a coaxial fixture. That is, the support 102 and external tile 109 were not included because of the obvious difficulties in testing. However, since an electromagnetic wave is 100% reflected from a conductive metal layer, and since tests show that the external tile 109 does not significantly affect the absorber, the experimental results discussed herein are a good approximation to the actual panel 100. Absorber element 106A includes a material 112, which is preferably a dielectric material, but also may be any of the materials in Table 1. In the embodiment of FIG. 3, any of the dielectrics indicated in Table 1 below may be used, though in this embodiment the dielectric 112 is preferably a high dielectric constant material. Layer 114 is a ferrite. It may be any ferrite, though preferably it is a nickel-zinc ferrite, a copper-zinc ferrite, or a cobalt-zinc ferrite, and most preferably $Ni_{0.4}Zn_{0.6}Fe_2O_4$. Preferably the dielectric material 112 is significantly thinner than the ferrite 114, particularly if it is a high dielectric constant material. When material 112 is a high dielectric constant material it is generally, 2 to 10 times thinner, and most preferably, about 3 to 6 times thinner than the ferrite 114. In the embodiment of FIG. 3, the material 112 is farther from the reflector 104 and closer to the exterior of the panel 100. It has also been found that high dielectric constant materials are generally highly desirable in wave absorption panels, whatever their relative position with respect to other absorber materials. In this disclosure "high dielectric constant" means a dielectric constant of 20 or more, and preferably 50 or more, and "low dielectric constant material" means a material with a dielectric constant of 10 or less. Preferably, low dielectric constant materials may be silicon glass or a plastic, such as Teflon™, a polycarbonate, a polyvinyl, or other polymer. Aluminum oxide also may be used. High dielectric material 112 may be a metal oxide that is ferroelectric at some temperature, though it may not be ferroelectric at room temperature. Examples of high dielectric constant materials useful in wave absorption panels are the $ABO_3$ type perovskites, including dielectrics and ferroelectrics, such as barium strontium titanate (BST), barium titanate, and the layered superlattice materials, also including both dielectrics and ferroelectrics, such as strontium bismuth tantalate, strontium bismuth tantalum niobate, and barium bismuth niobate. The $ABO_3$ type perovskites are discussed in Franco Jona and G. Shirane, *Ferroelectric Crystals,* Dover Publications, New York, pp. 108 et seq. The layered superlattice materials are discussed in U.S. Pat. No. 5,519,234 issued May 21, 1996. Other materials that may be layered with the ferrite 114 include conducting oxides such as $La_{1-x}Sr_xMnO_3$ (LSM) and $Fe_3O_4$, magnetoresistive materials, including some formulations of LSM, e.g. $La_{0.67}Sr_{0.33}MnO_3$, as well as $La_xCa_{(1-x)}MnO_3$ and $La_xPb_{(1-x)}MnO_3$, signet magnetics, such as $BaTiO_3+BiFeO_3$, magnetoplumbites, such as $BaO.6Fe_2O_3$, garnets, such as yttrium iron garnet ($3Y_2O_3.5Fe_2O_4$ or $Y_6Fe_{10}O_{24}$), and many others.

A summary of the various classes of materials that can be used as in the embodiment of FIG. 3, as well as all other embodiments of the invention disclosed herein is given in Table 1. It should be understood that the characteristics are

TABLE 1

| Materials Class | Examples of Materials in Class | General Characteristics of Materials in Class |
|---|---|---|
| Conducting oxides | LSM | high $\epsilon'$, high $\epsilon''$, very low $\mu$ |
| Magnetoresistive materials | $La_{0.67}Sr_{0.33}MnO_3$, $La_xCa_{(1-x)}MnO_3$, $La_xPb_{(1-x)}MnO_3$, | moderate $\epsilon'$, high $\epsilon''$ |
| Miscellaneous Dielectrics | Silicon glass, $Al_2O_3$ | low to moderate $\epsilon'$, low $\epsilon''$, $\mu = 1$ |
| $ABO_3$ type dielectrics | BST | high $\epsilon'$, low $\epsilon''$, $\mu = 1$ |
| Layered superlattice material dielectrics | $BaBi_2Nb_2O_9$, | high $\epsilon'$, low $\epsilon''$, $\mu = 1$ |
| Polymer dielectrics | Polycarbonates, Teflon, Polyvinyls | low $\epsilon'$, low $\epsilon''$, $\mu = 1$ |
| $ABO_3$ type Ferroelectrics | $BaTiO_3$ | high $\epsilon'$, moderate $\epsilon''$, $\mu = 1$ |
| Layered superlattice material ferroelectrics | $SrBi_2Ta_2O_9$ | high $\epsilon'$, moderate $\epsilon''$, $\mu = 1$ |
| Magnetoplumbites | $Ba0.6Fe_2O_3$ | moderate $\epsilon$, high $\mu'$, low $\mu''$ |
| Signet magnetics | $BaTiO_3 + BiFeO_3$, $BaTiO_3 + BaFeO_3$, BaO.3 $BaTiO_3.3Fe_2O_3$ | high $\epsilon'$, moderate $\epsilon''$, low $\mu$ (<1 GHz) moderate $\mu$ (>1 GHz) |
| Miscellaneous ceramics (generally dielectrics) | $SrTa_2O_6$ | high $\epsilon'$, low $\epsilon''$, $\mu = 1$ |
| Ferrites | $Ni_xZn_{(1-x)}Fe_2O_4$, $Cu_xZn_{(1-x)}Fe_2O_4$, $Co_xZn_{(1-x)}Fe_2O_4$, $Mn_xZn_{(1-x)}Fe_2O_4$ | low $\mu'$, high $\mu''$, low $\epsilon$ |
| Garnets | $Y_3Fe_5O_{12}$ | moderate $\epsilon'$, $\epsilon''$, $\mu'$ and $\mu''$ |
| Polymer-ceramic composites | Above polymers combined with most above materials | very light weight, $\epsilon$ and $\mu$ reflect corresponding ceramic values to wt. % of ceramics |

generalized, and may differ sometimes for an individual material in the given class. Note that a period in a formula separates two parts of a material that may be present in different proportions; for example, $BaO.6Fe_2O_3$ means a combination of 1 unit of BaO and 6 units of $Fe_2O_3$, which is conventional notation for materials such as magnetoplumbites and signet magnetics. Table 1 lists "composites" as one type of dielectric. Numerous such composites are discussed below. In this disclosure, a "composite" means a material that is made up of a uniform mixture of at least two distinct materials, as for example, a ceramic powder uniformly distributed throughout a polymer.

Figure 5:
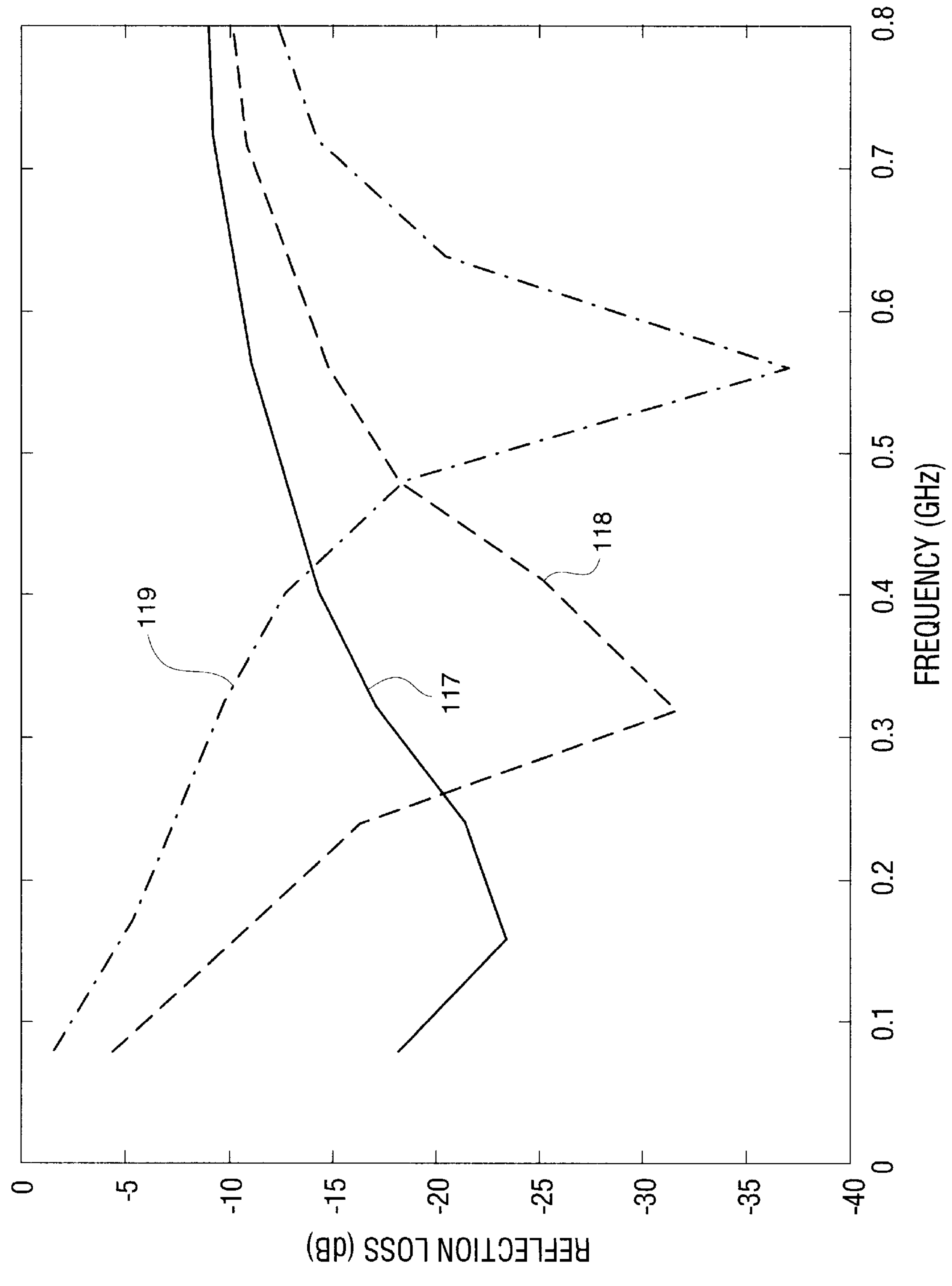
FIG. 5 shows reflection loss vs. frequency curves for three different high dielectric constant/ferrite wave absorption tiles according to the invention.

FIG. 5 shows the absorption performance of three different multi-layer absorption tiles 106A made of a high dielectric constant material and a ferrite. Each of curves 117, 118, and 119 show the reflection loss in decibels (dB) as a function of frequency in gigahertz (GHz). Reflection loss is the loss which is measured by comparing the amount of radiation incident on side 109 with the amount of radiation that is reflected from side 109. All curves were measured at room temperature. Curve 117 is the reflection loss as a function of frequency for a tile 106A in which layer 112 is 1 millimeter (mm) of strontium tantalate ($SrTa_2O_6$), and layer 114 is 5 mm of nickel-zinc ferrite ($Ni_{0.4}Zn_{0.6}Fe_2O_4$), which is a solid solution of two ferrites: $NiFe_2O_4$ and $ZnFe_2O_4$. Curve 118 is the reflection loss as a function of frequency for a tile 106A in which layer 112 is 1 millimeter (mm) of strontium tantalate ($SrTa_2O_6$), and layer 114 is 4 mm of nickel-zinc ferrite ($Ni_{0.4}Zn_{0.6}Fe_2O_4$). Curve 119 is the reflection loss as a function of frequency for a tile 106A in which layer 112 is 1 millimeter (mm) of strontium tantalate ($SrTa_2O_6$), and layer 114 is 5 mm of manganese ferrite ($MnFe_2O_4$). The dielectric constant of the $SrTa_2O_6$ was approximately 90 while the dielectric constant of the $Ni_{0.4}Zn_{0.6}Fe_2O_4$ was approximately 10 (see FIG. 7). Generally, in the field of wave absorption panels, a material having a reflection loss of 20 dB or more of the incident radiation is considered to be a good absorber. Twenty dB absorption is a reduction that is large enough to make a significant difference in the electromagnetic impact of a building, since it is enough reduction that state-of-the-art electronic circuits can filter unwanted reflections. The absorption for the 1 mm/5 mm strontium tantalate/nickel-zinc ferrite curve 119 is within the range that it would be an acceptable absorber over a range of about 0.1 GHz to 0.3 GHz (100 megahertz to 300 megahertz. Decreasing the thickness of the nickel-zinc ferrite by one millimeter results in a tile that is an excellent absorber between about 0.25 GHz and 0.5 GHz as shown in curve 118. Changing the ferrite to a manganese ferrite results in a tile that is an excellent absorber in the range between about 0.5 GHz and 0.65 GHz. This would be an excellent choice for a building the electromagnetic impact statement of which showed that absorption in this range was critical. Generally, ferrites have low dielectric constant, $\epsilon'$, a low or moderate imaginary part of the permeability, $\epsilon''$, a low real part of the permeability, $\mu'$, and a high imaginary part of the permeability, $\mu''$.

Perhaps the most important fact that can be drawn from the curves of FIG. 5 is that the absorption peak frequency and the width of the absorption peak are strongly affected by small changes in thickness and by changes in materials. Thus, the high dielectric constant/ferrite absorber can be tuned by design to cover a range of about 200 megahertz almost anywhere in the complete television frequency range, i.e. from about 0.1 GHz to about 8 GHz.

Figure 4:
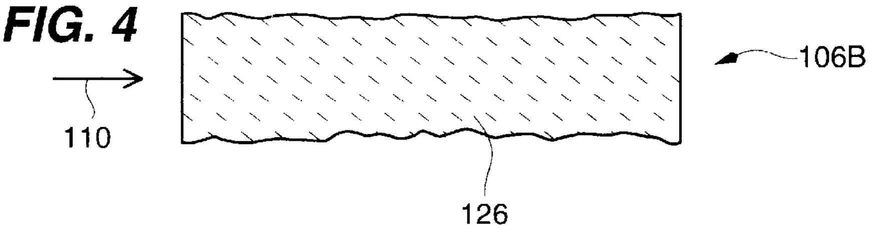
FIG. 4 shows a cross-sectional view of an alternative preferred embodiment of the wave absorbing layer of the panel of FIG. 1.
Figure 6:
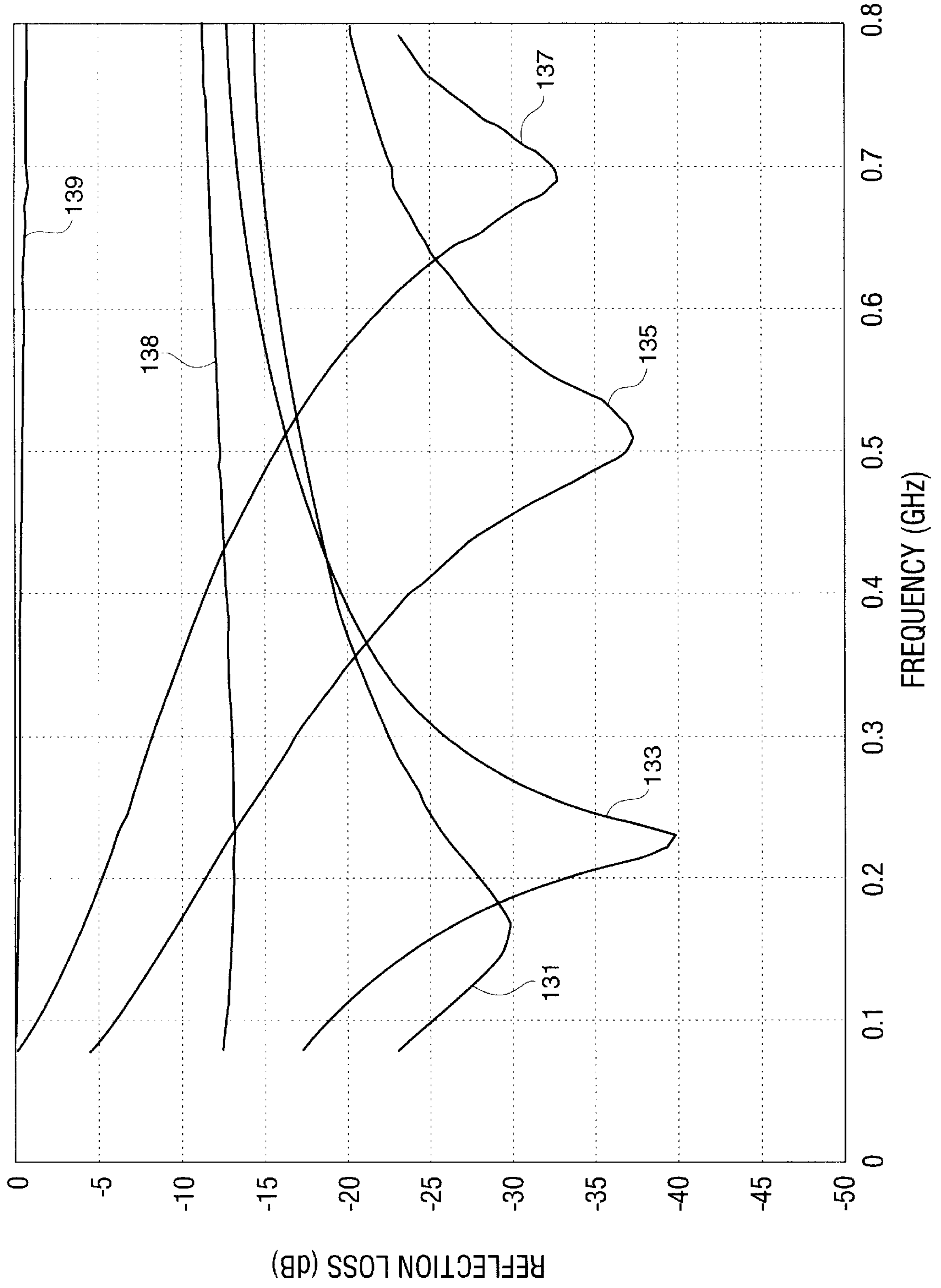
FIG. 6 shows reflection loss vs. frequency curves for six different nickel-zinc ferrite solid solutions.

A wave absorber element 106B comprising a solid solution of two or more ferrites is illustrated in FIG. 4. Such a solid solution, by itself, has been found to be superior to a single ferrite, particularly when a specific frequency range is of critical concern. The peak absorption frequency and the breadth of the absorption peak are highly dependent on the ratio of the particular ferrites in the solid solution and the thickness of the absorber. This is illustrated in FIG. 6, which shows the absorption performance of six different nickel-zinc ferrite solid solutions. The chemical formula of the solid solutions and the thickness of each tile are given in Table 2.

TABLE 2

| Curve No. | Solid Solution | Thickness |
|---|---|---|
| 131 | $Ni_{0.4}Zn_{0.6}Fe_2O_4$ | 6 mm |
| 133 | $Ni_{0.35}Zn_{0.65}Fe_2O_4$ | 7 mm |
| 135 | $Ni_{0.50}Zn_{0.50}Fe_2O_4$ | 4 mm |
| 137 | $Ni_{0.4}Fe_2O_4$ | 9 mm |
| 138 | $Ni_{0.3}Zn_{0.7}Fe_2O_4$ | 10 mm |
| 139 | $Ni_{0.25}Zn_{0.75}Fe_2O_4$ | 10 mm |

Figure 7:
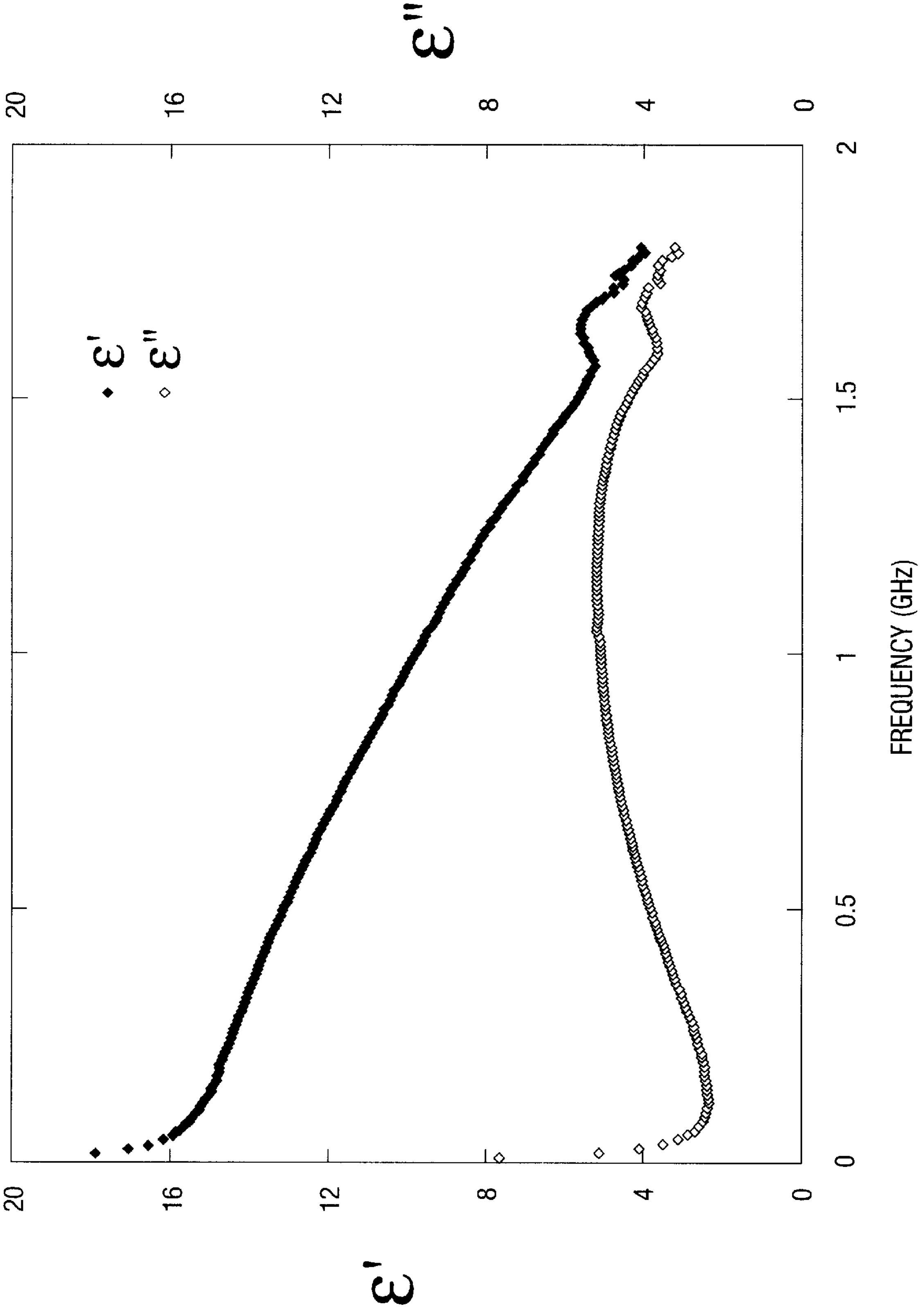
FIG. 7 shows the real and imaginary parts of the permittivity as a function of frequency for the ferrite $Ni_{0.4}Zn_{0.6}Fe_2O_4$.
Figure 8:
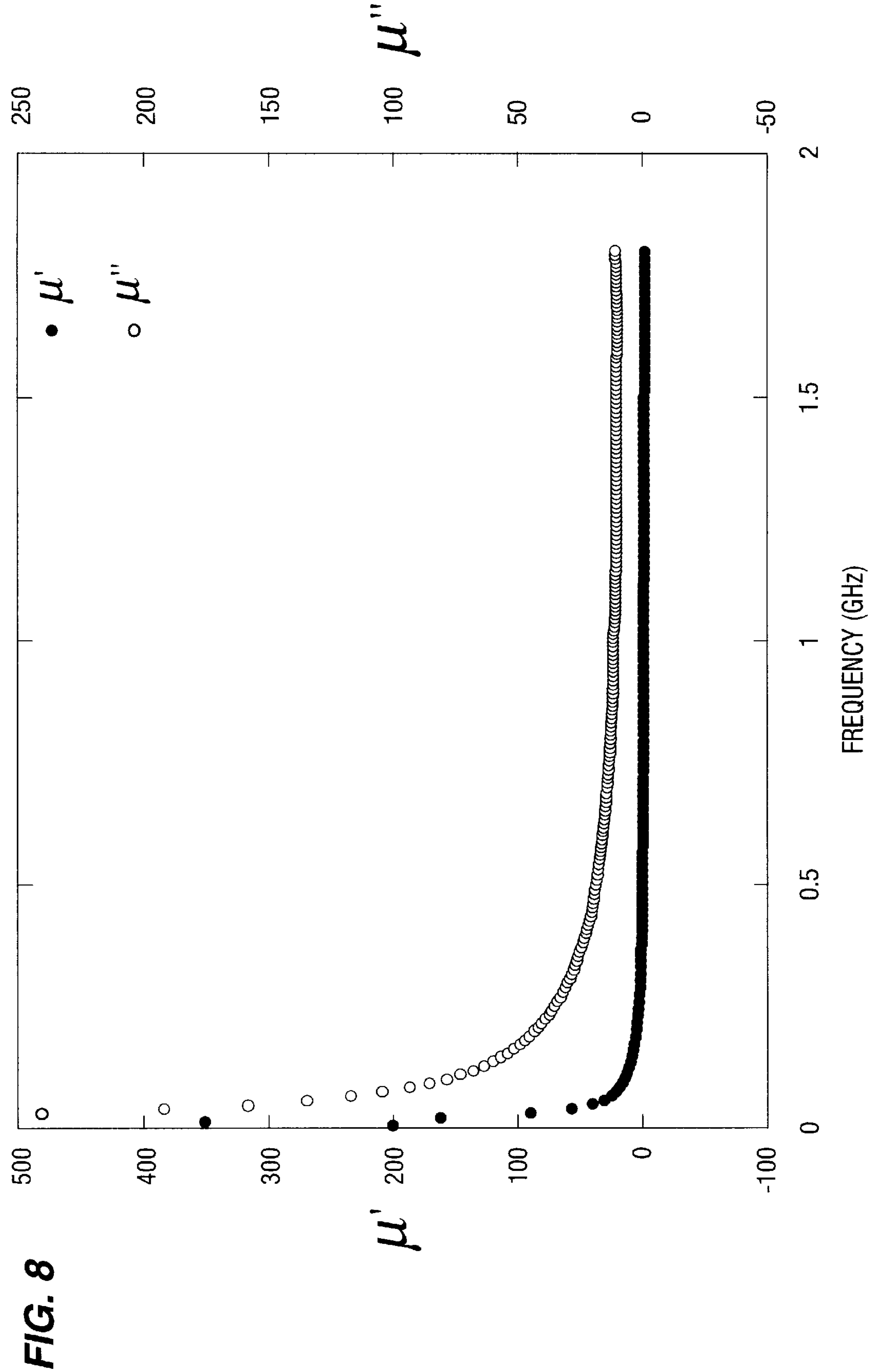
FIG. 8 shows the real and imaginary parts of the permeability as a function of frequency for the ferrite $Ni_{0.4}Zn_{0.6}Fe_2O_4$.

From the results shown in FIG. 6, it is evident that the solid solution, like the layered tile of FIG. 3, lends itself to the design of an absorption tile that absorbs over a desired frequency range. Together, the $Ni_{0.4}Zn_{0.6}Fe_2O_4$, $Ni_{0.50}Zn_{0.50}Fe_2O_4$ solid solutions provide a reflection loss of 20 dB or greater over the entire television frequency range, with $Ni_{0.4}Zn_{0.6}Fe_2O_4$ being particularly appropriate for VHF and $Ni_{0.50}Zn_{0.50}Fe_2O_4$ being particularly appropriate for UHF. The ability of a ferrite to function as a wave absorber is related to the permittivity and the permeability of the material as a function of frequency. In this disclosure, when we refer to the "permittivity" we mean a parameter that is in units corresponding to the dielectric constant. That is the real part of the "permittivity" is identical to the dielectric constant. FIGS. 7 and 8 show the permittivity, $\epsilon$, and the permeability, $\mu$, respectively, for the solid solution ferrite $Ni_{0.4}Zn_{0.6}Fe_2O_4$. In FIG. 7, $\epsilon'$, the real part of the permitivity, and $\epsilon''$, the imaginary part of the permitivity, are shown as a function of frequency in gigahertz. In FIG. 8, $\mu'$, the real part of the permeability (dielectric constant), and $\mu''$, the imaginary part of the permeability, are shown as a function of frequency in gigahertz. This curve is quite instructive. In most materials, the imaginary part of the permitivity, $\epsilon''$, and the imaginary part of the permeability, $\mu''$, are much smaller than the real parts of the corresponding parameters. However, in the nickel-zinc ferrite the imaginary part of the permeability, $\mu''$, is larger than the real part of the permeability, $\mu'$. The imaginary part of the permeability, $\mu''$, is unusually high in this ferrite.

Figure 9:
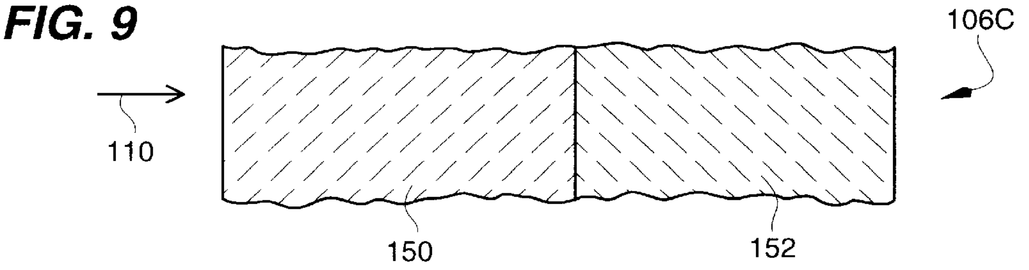
FIGS. 9 through 15 show cross-sectional views of alternative preferred embodiments of the wave absorbing layer of the panel of FIG. 1.
Figure 16:
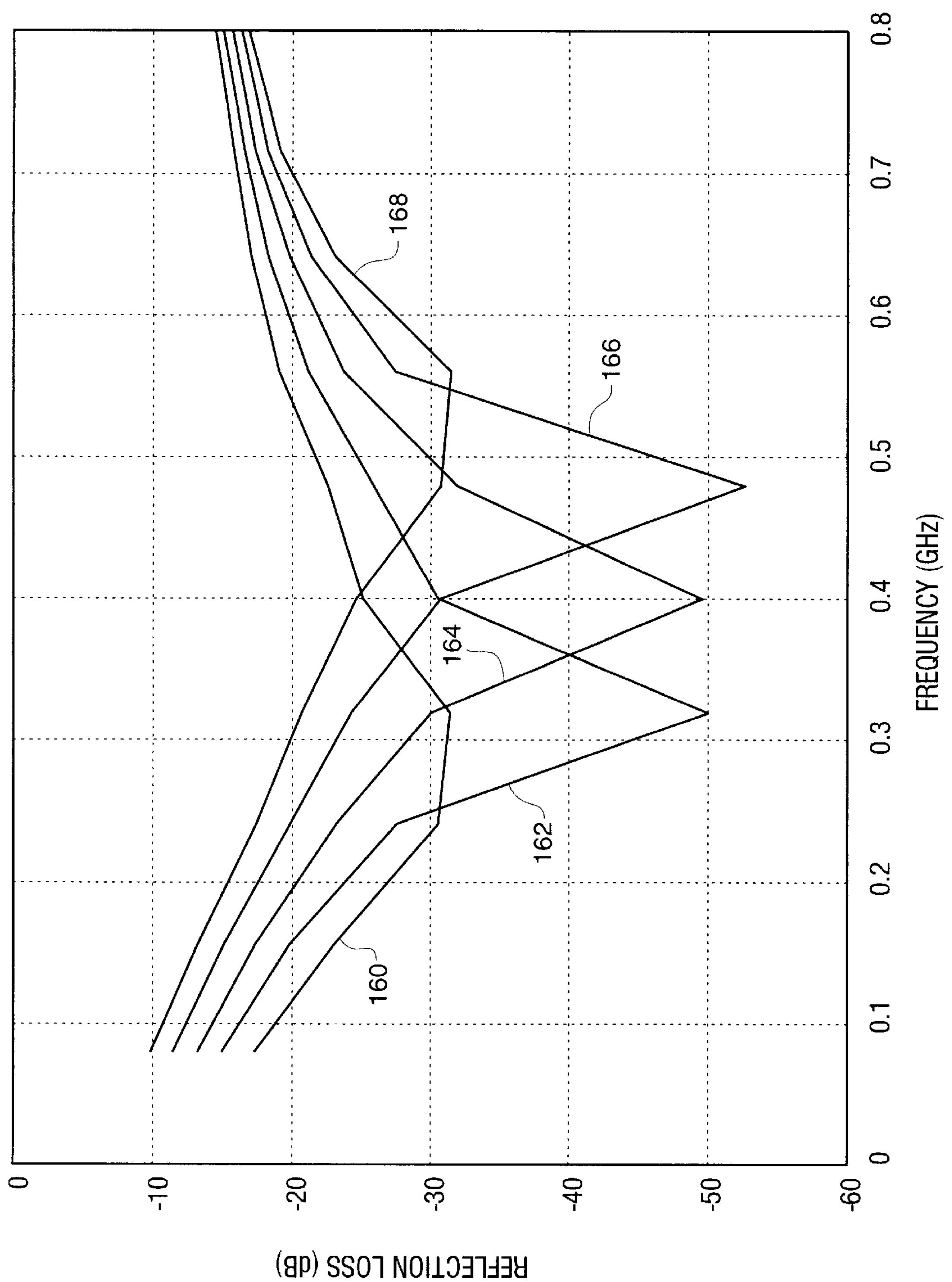
FIG. 16 shows reflection loss vs. frequency curves for five different thickness combinations of a multilayered wave absorber fabricated of a layer of manganese ferrite and a layer of nickel-zinc solid solution ferrite.

Another way that one can "mix" ferrites to design an absorber element 106 is by fabricating multi-layer ferrite absorbers. Such a multi-layer ferrite absorber 106C is shown in FIG. 9. In this embodiment of the invention, the absorber element 106C comprises two or more layers, 150 and 152, of ferrite materials, with layer 150 being a different ferrite than layer 152. Again, the peak absorption frequency and the breath of the absorption curve vary depending on the specific ferrite in the layers 150, 152 and the thickness of each layer. In FIG. 16 the reflective loss in dB is shown as a function of frequency in GHz for five different thickness combinations of a multilayered absorber 106C fabricated of a layer 150 of manganese ferrite and a layer 152 of the nickel-zinc solid solution ferrite. The thickness of each of the manganese ferrite and the nickel-zinc ferrite multi-layer combinations is given in Table 3.

TABLE 3

| Curve Number | $MnFe_2O_4$ Thickness (mm)/$Ni_{0.4}Zn_{0.6}Fe_2O_4$ Thickness (mm) |
|---|---|
| 150 | 1/5 |
| 152 | 1.5/4.5 |
| 154 | 2/4 |
| 156 | 2.5/3.5 |
| 158 | 3/3 |

Viewed individually, each of the multi-layered ferrite absorbers provides a reflection loss of greater than 20 dB over a wide range that covers about ⅔ of the entire TV spectrum. For example the curve 152 for a multi-layer absorber combining 1.5 mm thick layer of $MnFe_2O_4$ with a 4.5 mm thick layer of $Ni_{0.4}Zn_{0.6}Fe_2O_4$ shows that this absorber 106C would be highly effective to absorb the entire VHF frequency spectrum. Viewed as a group, it is evident from the results shown in FIG. 16 that the multi-layer absorber 106C composed of multiple ferrite layers can be designed so as to shift the frequency peak to any specific frequency over a relatively wide range of frequencies in the heart of the television spectrum, without significant change in the absolute magnitude of the reflection loss.

Figure 10:
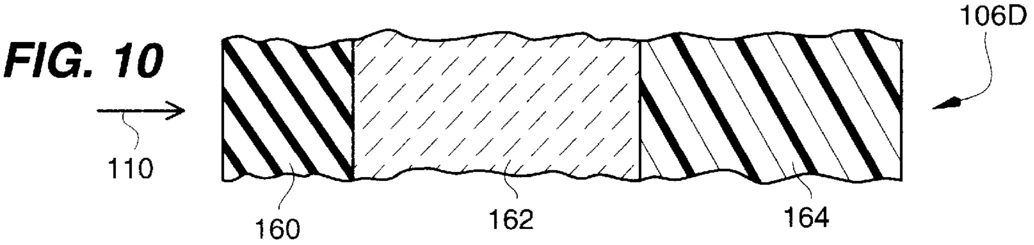

FIG. 10 shows another embodiment 106D of the absorber element 106 according to the invention. This embodiment comprises a high dielectric constant material 160, a ferrite 162 and a low dielectric constant material 164. The high dielectric constant material 160 is preferably a ferroelectric ceramic material such as barium titanate ($BaTiO_3$), though it may be other high dielectric constant material such as BST or other $ABO_3$ type perovskites, other layered superlattice materials, or signet magnetics, such as $BaTiO_3$+$BaFeO_3$. See U.S. Pat. No. 5,519,234 issued to Araujo et al. on May 21, 1996 for a full description of layered superlattice materials. Signet magnetics include $BaTiO_3$+$BaFeO_3$, $BaTiO_3$+$BiFeO_3$, and $BaO.3BaTiO_3.3Fe_2O_3$. Ferrite 162 is preferably $Ni_{0.4}Zn_{0.6}Fe_2O_4$, though it may be any of the other ferrites discussed above. Low dielectric constant material 164 is preferably a polymer, such as Teflon™, a polycarbonate or a polyvinyl such as Butvar™, but may be other plastics or other relatively light weight low dielectric material.

Figure 17:
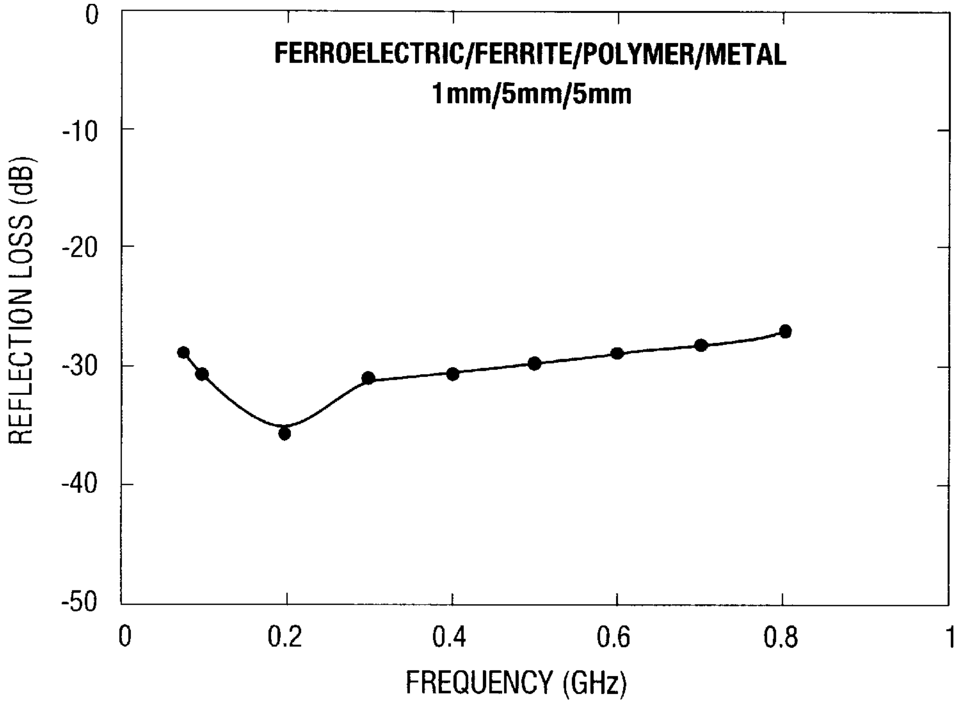
FIG. 17 shows a computer simulation of the reflection loss versus frequency for an absorption panel comprising 1 mm of a 50/50 solid solution of $BaTiO_3$+$BaFeO_3$, 5 mm of $Ni_{0.4}Zn_{0.6}Fe_2O_4$, and 5 mm of Teflon™.

FIG. 17 shows a computer simulation of the reflection loss in dB versus frequency in gigahertz for an absorption panel 100 having an absorber element 106D comprising 1 mm of a 50/50 solid solution of $BaTiO_3$+$BaO.6Fe_2O_3$, 5 mm of $Ni_{0.4}Zn_{0.6}Fe_2O_4$, and 5 mm of Teflon™. This panel provides a reflective loss of approximately 30 dB across the entire television frequency spectrum, which is the best reflective loss in this frequency range of any absorption panel known to date. This is also an excellent absorber for airports in that it absorbs well in the frequency range of airport control systems, i.e. about 0.1 gigahertz to about 0.4 gigahertz.

Figure 11:
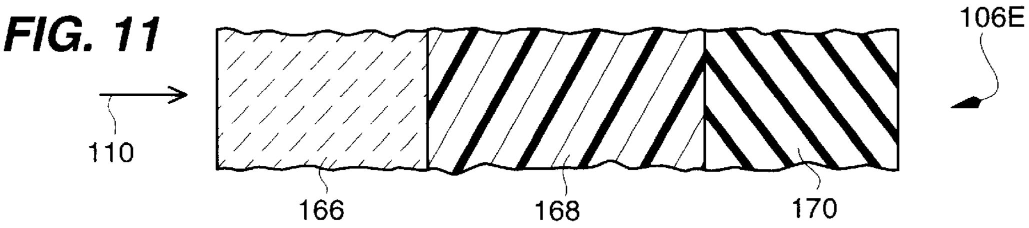
Figure 18:
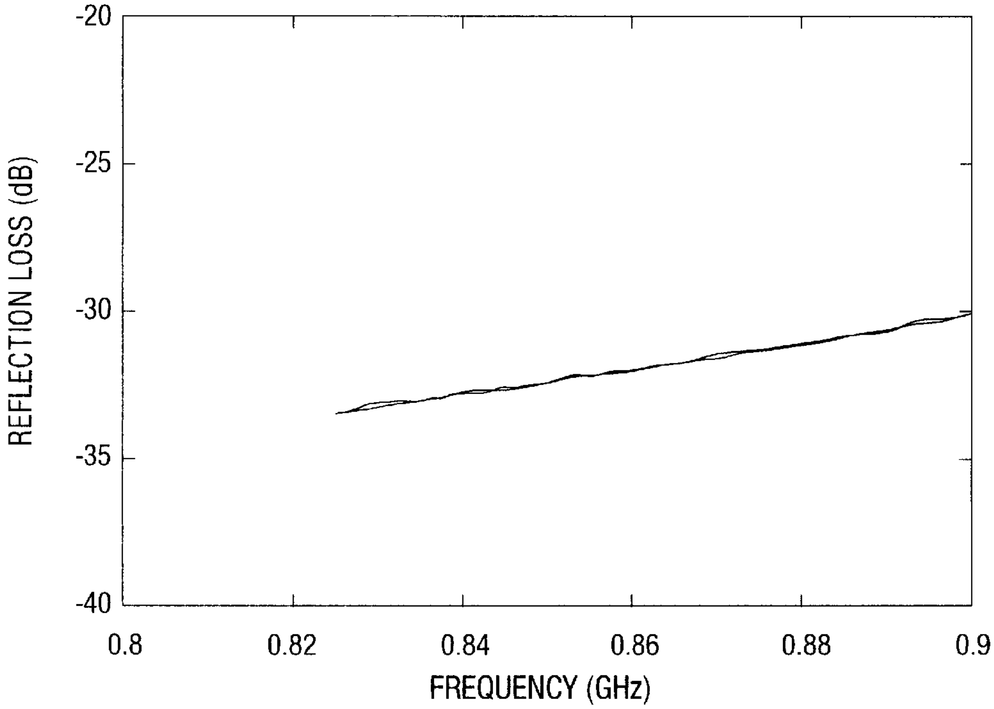
FIG. 18 shows a computer simulation of the reflective loss versus frequency for an absorption panel comprising a ferrite/polymer/high dielectric constant absorption layer having 5 mm of $Ni_{0.4}Zn_{0.6}Fe_2O_4$, 4 mm of polycarbonate, and 1 mm of 70/30 BST.

FIG. 11 shows an alternative embodiment 106E of the absorber element 106 in which a ferrite 166 and a high dielectric constant material 170 sandwich a polymer 168. The preferred materials for this embodiment are the same as those for the embodiment of FIG. 10, except in a different order. FIG. 18 shows a computer simulation of the reflective loss in dB versus frequency in GHz for an absorption panel 100 having a ferrite/polymer/high dielectric constant absorber element 106E having 5 mm of $Ni_{0.4}Zn_{0.6}Fe_2O_4$, 4 mm of polycarbonate, and 1 mm of 70/30 BST, i.e. $Ba_{0.7}Sr_{0.3}TiO_3$. This embodiment has excellent absorption in the 800 MHz–900 MHz frequency range, and thus will make an excellent absorption panel when absorption in this range is critical, as for example when the electromagnetic wave that needs to be absorbed is a radio local area network (LAN) system.

Figure 12:
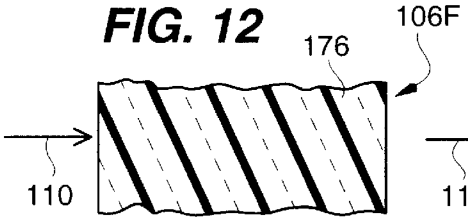

FIG. 12 shows another alternative embodiment 106F of a wave absorber element 106. This embodiment comprises a polymer-ceramic composite layer 176. The preferred polymer is polycarbonate or polyvinyl, though it also may be Teflon™ or any other suitable light-weight, relatively strong polymer. A powdered form of any of the ceramic materials mentioned above may be embedded in the polymer. Preferred ceramic materials are shown in Table 4 along with the mean values of the real and imaginary parts of the dielectric constant, ε' and ε", and the real and imaginary parts of the permeability, μ' and μ" between 100 MHz and 1 GHz for each material.

TABLE 4

| Material | ε' | ε" | μ' | μ" |
|---|---|---|---|---|
| 20% $BaTiO_3$ + 80% $BiFeO_3$ | 40 | 1 | 1.0 | 0.1 |
| 40% $BaTiO_3$ + 60% $BiFeO_3$ | 90 | 8 | 1.1 | 0.1 |
| 50% $BaTiO_3$ + 50% $BiFeO_3$ | 100 | 10 | 1.2 | 0.1 |
| 60% $BaTiO_3$ + 40% $BiFeO_3$ | 200 | 32 | | |
| 80% $BaTiO_3$ + 20% $BiFeO_3$ | 300 | 30 | 1.2 | 0.1 |
| 60% $BaTiO_3$ + 40% $BiFeO_3$ + 1% Ni | 48 | 4 | 1.3 | 0.1 |
| 60% $BaTiO_3$ + 40% $BiFeO_3$ + 4% Ni | 53 | 5 | 1.3 | 0.1 |
| $4BaO.3TiO_2.3Fe_2O_3$ | 3.6 | negligible | 1.0 | 0.1 |
| $BaTiO_3$ + $BiFeO_3$ + $Bi_4Ti_3O_{12}$ | 180 | 10 | 1.0 | 0.1 |
| $Fe_3O_4$ | 400 | 300 | 1.5 | 0.5 |
| Ba-Ferrite ($BaO.6Fe_2O_3$) | 35 | 5 | 1.3 | 0.2 |
| Ba-Ferrite + $BaTiO_3$ | 60 | 30 | 1.3 | 0.2 |
| LSM | 250 | 250 | | |
| Strontium bismuth tantalate | 65 | 0.6 | 1.0 | 0.1 |
| Silicon Ferrite | 10 | 1 | 1 | 20 |

Experimental data for the preferred polycarbonate polymer and composites of some of the ceramic materials of Table 4 with the polycarbonate polymer are shown in Table 5. Again the mean values of the real and imaginary parts of the dielectric constant, ε' and ε", and the real and imaginary parts of the permeability, μ' and μ" between 100 MHz and 1 GHz are given for the polymer and for each composite material.

TABLE 5

| Material | Ceramic wt. % | ε' | ε" | μ' | μ" |
|---|---|---|---|---|---|
| Polymer | 0 | 2.1 | 0.01 | 1.0 | 0.01 |
| $BaTiO_3.BiFeO_3$ | 20 | 3.2 | 0.05 | 1.0 | 0.01 |
| $BaTiO_3.BiFeO_3$ | 40 | 4.2 | 0.1 | 1.0 | 0.01 |
| $BaTiO_3.BiFeO_3$ | 50 | 4.4 | 0.1 | 1.0 | 0.01 |
| $BaTiO_3.BiFeO_3$ | 75 | 6.5 | 0.3 | 1.0 | 0.01 |
| $4BaO.3TiO_2.3Fe_2O_3$ | 40 | 4.0 | 0.08 | 1.0 | 0.01 |
| $Fe_2O_3$ | 40 | 6.0 | 0.8 | 1.0 | 0.01 |
| Ba-Ferrite | 40 | 4.0 | 0.2 | 1.0 | 0.01 |
| BST ($Ba_xSr_{(1-x)}TiO_3$) | 40 | 7.0 | 0.05 | 1.0 | 0.01 |

Figure 19:
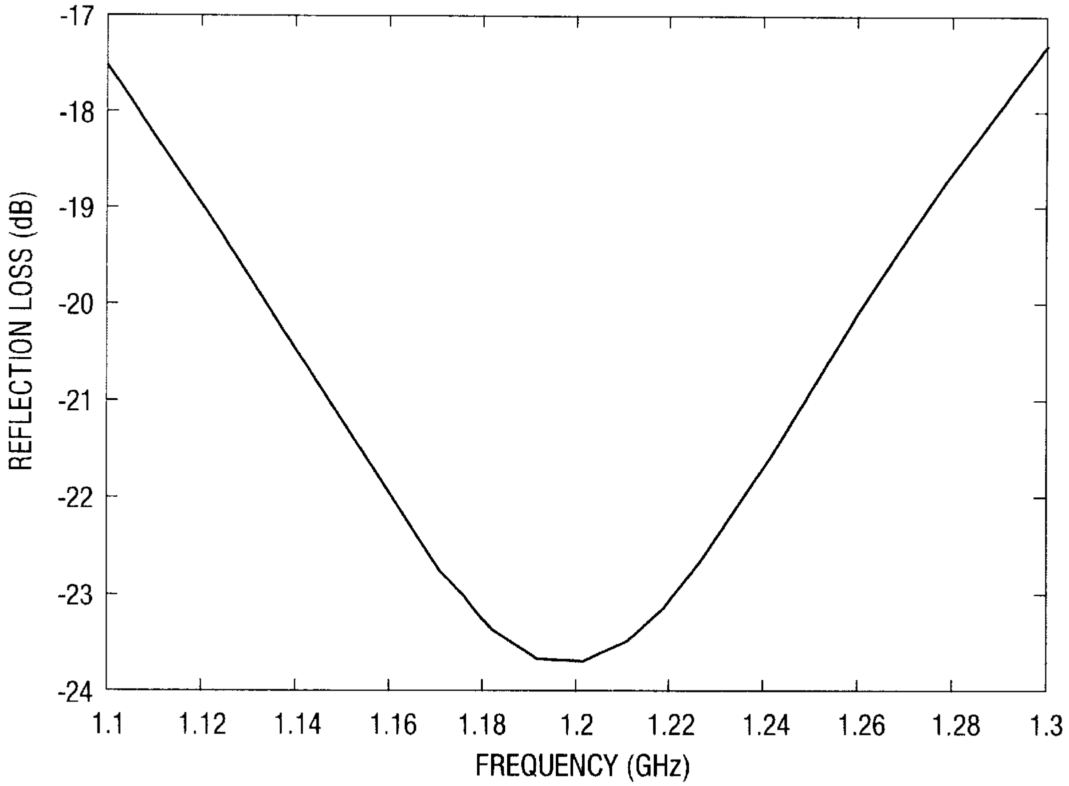
FIG. 19 shows a computer simulation of the reflective loss versus frequency for an absorption panel including a polymer-ceramic composite absorption layer comprising 13 mm of 50% polycarbonate and 50% ($BaTiO_3$+4$BiFeO_3$)

FIG. 19 shows a computer simulation of the reflective loss in dB versus the frequency in GHz for an absorption panel 100 including a polymer-ceramic composite absorber element 106F comprising 13 mm of 50% polycarbonate and 50% ($0.25BaTiO_3$+$0.75BiFeO_3$). This shows good absorptivity in the high frequency radio spectrum.

Figure 13:
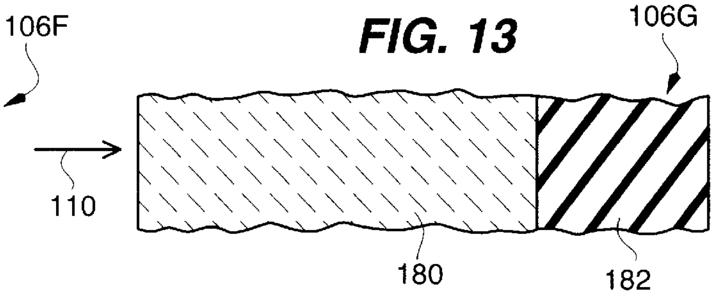

FIG. 13 shows an embodiment 106G of the absorber 106 according to the invention comprising a ferrite 180 and a material 182. This embodiment is the same as the embodiment of FIG. 3, except that the positions of the ferrite 180 and the material 182 with respect to the incident radiation 110 are reversed. The ferrite 180 may be any of the ferrites listed in Table 1 or mentioned in the discussion of FIG. 3. For the television applications, a nickel-zinc ferrite, and in particular $Ni_{0.4}Zn_{0.6}Fe_2O_4$, is preferred. The material 182 may be any of the materials listed in Table 1 or mentioned in the discussion of FIG. 3. Again, dielectric materials are preferred, though some of the other materials, such as LSM, in some frequency ranges give results better than the results with the dielectrics. In this embodiment both a low or high dielectric constant material have been found to give good results, depending on the ferrite. It is noted that in situations in which the dielectric material is closer to the incident radiation 110, i.e. the embodiment of FIG. 3, a high dielectric constant material is preferred, while in the situations where the dielectric material is between the ferrite and the metal 104, such as FIG. 13, a low dielectric constant material, i.e. a material with a dielectric constant up to 10, can also provide excellent results. While materials with low dielectric constant are not good absorbers by themselves in the MHz frequency range, when used as a sandwich layer between a ferrite and the metal, they significantly improve the overall absorption performance of the system 100.

Figure 20:
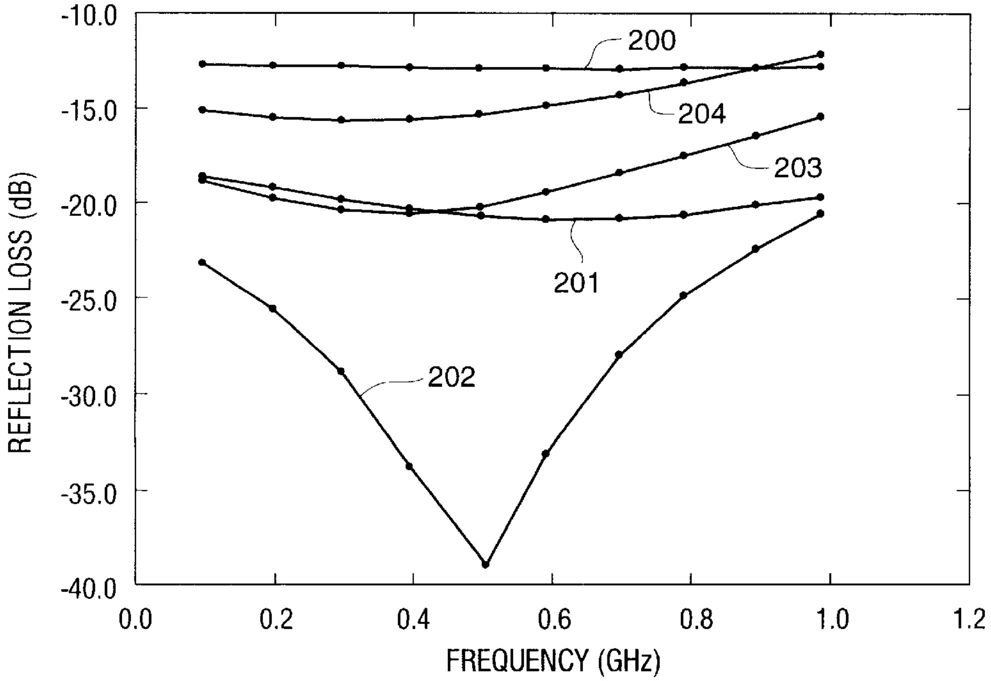
FIG. 20 shows a computer simulated graph of reflective loss versus frequency for a ferrite/high dielectric constant wave absorber comprising $Ni_{0.4}Zn_{0.6}Fe_2O_4$ as the ferrite and BST as the dielectric 182 and having no reflective layer.

FIG. 20 shows a computer simulated graph of reflective loss in dB versus frequency in GHz for five different thicknesses of a ferrite/high dielectric constant material wave absorber 106G comprising $Ni_{0.4}Zn_{0.6}Fe_2O_4$ as the ferrite and BST as the dielectric 182. In this particular embodiment, there is no reflective element 104. The thickness of the ferrite layer 180 for each curve is shown in Table 6. The thickness of the dielectric 182 was sufficient so that no radiation passed through the sample, or, for computer simulation purposes, infinite. Practically, a few inches of a foot of most materials would result in no radiation passing through the sample. Since no radiation passes through the sample, it is either absorbed or reflected, and thus, the reflective loss again is a suitable measure of the absorptive properties as before.

TABLE 6

| Curve Number | Thickness in mm |
|---|---|
| 200 | 3 |
| 201 | 4 |
| 202 | 5 |
| 203 | 6 |
| 204 | 7 |

As can be seen from the figure, the absorption is high for one thickness of the dielectric, and relatively low otherwise. Thus, the thickness of the wave absorber element 106G appears to be even more important if there is no reflective element 104. Another computer simulated graph for an embodiment 106G of a wave absorber was made for a sample in which the ferrite 180 was $Ni_{0.4}Zn_{0.6}Fe_2O_4$, the material 182 was LSM, and a metal back plate 104 was included. This gave similar results to the curves of FIG. 20, but the absorption was about 32 dB, and the absorption was not as strongly dependent on thickness. The largest absorption was for an embodiment in which the ferrite 180 was 5 mm in thickness and the LSM was 5 mm in thickness. A further computer simulated graph for an embodiment 106G of a wave absorber was made for a sample in which the ferrite 180 was $Ni_{0.4}Zn_{0.6}Fe_2O_4$, the material 182 was a magnetoplumbite, $Ba_4Ti_3Fe_6O_{19}$, and a metal back plate 104 was included. This gave similar results to the curves of FIG. 20, but the lowest absorption was about −29 dB, and the absorption was not as strongly dependent on thickness. The largest absorption was for an embodiment in which the ferrite 180 was 5 mm in thickness and the magnetoplumbite was 5 mm in thickness. A fourth computer simulated graph for an embodiment 106G of a wave absorber was made for a sample in which the ferrite 180 was $Ni_{0.4}Zn_{0.6}Fe_2O_4$, the material 182 was aluminum oxide ($Al_2O_3$), and a metal back plate 104 was included. Aluminum oxide has a dielectric constant of about 9. This gave similar results to the curves of FIG. 20, but the lowest absorption was about −39 dB, that is, the absorption was a little larger than the absorption shown in FIG. 20, and the absorption was not as strongly dependent on thickness. The largest absorption was for an embodiment in which the ferrite 180 was 5 mm in thickness and the aluminum oxide was 1 mm in thickness. The aluminum oxide can be made by a liquid deposition process that is in some respects simpler than the ceramic fabrication process for other dielectrics and ferrites disclosed herein, and thus, this embodiment with aluminum oxide has some advantages over the others.

Figure 14:
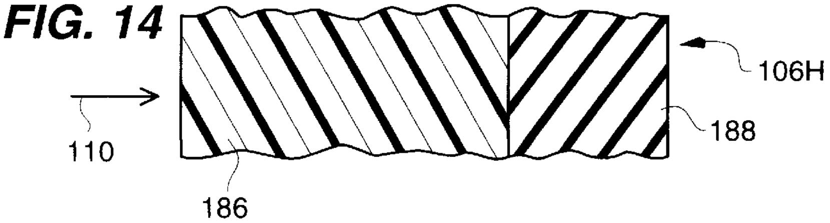
Figure 15:
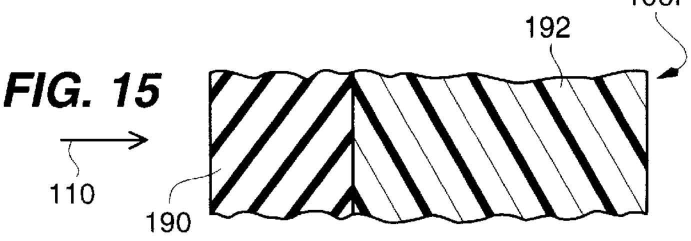

FIGS. 14 and 15 show two other embodiments of highly tuneable absorber systems. In FIG. 14 absorber 106H comprises a layer 186 of polymer and a layer 188 of another dielectric material. In FIG. 15, absorber 106I comprises a layer 109 of a dielectric material and a layer 192 of a polymer. Preferably, in each of the embodiments the dielectric material 188 and 190 has a higher dielectric constant than the polymer 186 and 192, respectively. While these embodiments show excellent tunability and the reflective loss is well over 20 dB in some frequency ranges, none of the combinations of actual materials tried have shown as good absorption characteristics as the embodiments of FIGS. 3, 10 and 11. In both embodiments, the preferred polymer is polycarbonate or polyvinyl and the preferred dielectric material is BST, though other polymers and dielectrics also may be used. The absorbers 106H and 106I are of particular importance because they are easily constructed and are relatively light.

Figure 21:
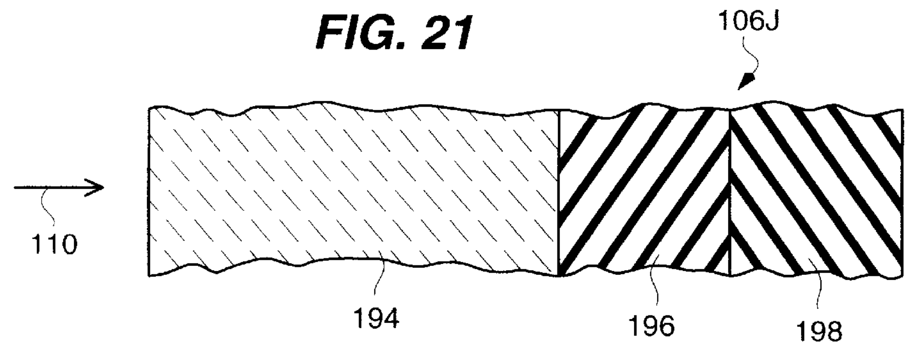
FIGS. 21 through 24 show cross-sectional views of alternative preferred embodiments of the wave absorbing layer of the panel of FIG. 1.

FIG. 21 shows another embodiment 106J of an absorber 106 that provides good results. Absorber element 106J comprise a layer 194 of a ferrite, a layer 196 of a low dielectric constant material, and a layer 198 of a high dielectric constant material. This embodiment 106J is the same as the embodiment of FIG. 11, except that it has been generalized to include any low dielectric constant material 196, not just a polymer. Silicon glass is an appropriate low dielectric constant material, while the preferred ferrites 194 and high dielectric constant material 198 are as discussed in connection with FIG. 11. This embodiment 106J can be tuned to give much the same performance as the embodiment 106E of FIG. 1. Computer simulated reflective loss curves have been run for an absorber 106J in which the ferrite 194 was $Ni_{0.4}Zn_{0.6}Fe_2O_4$, dielectric 196 was silicon glass, and dielectric 198 was BST. The best absorption was for an absorber 106J in which layer 194 was 5 mm thick, layer 196 was 4 mm thick, and layer 198 was 1 mm thick. The reflective loss was above 20 dB for the entire TV spectrum for this absorber, with a peak absorption of near 35 dB.

Figure 22:
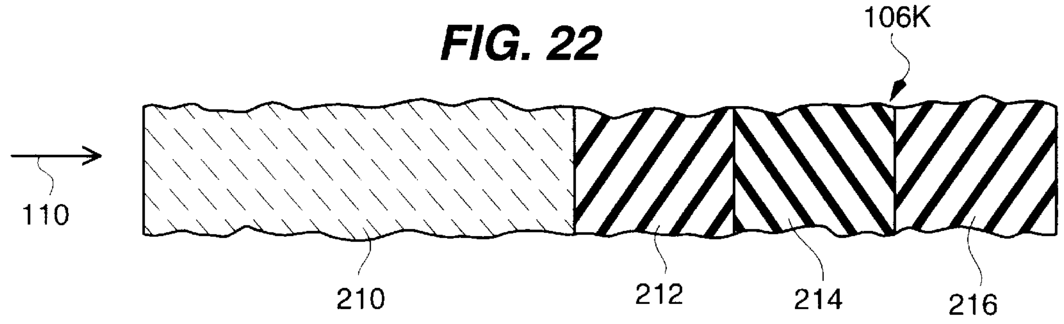
Figure 23:
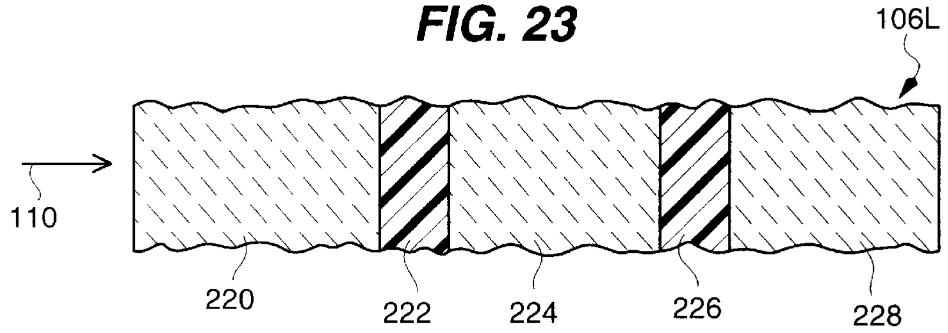
Figure 24:
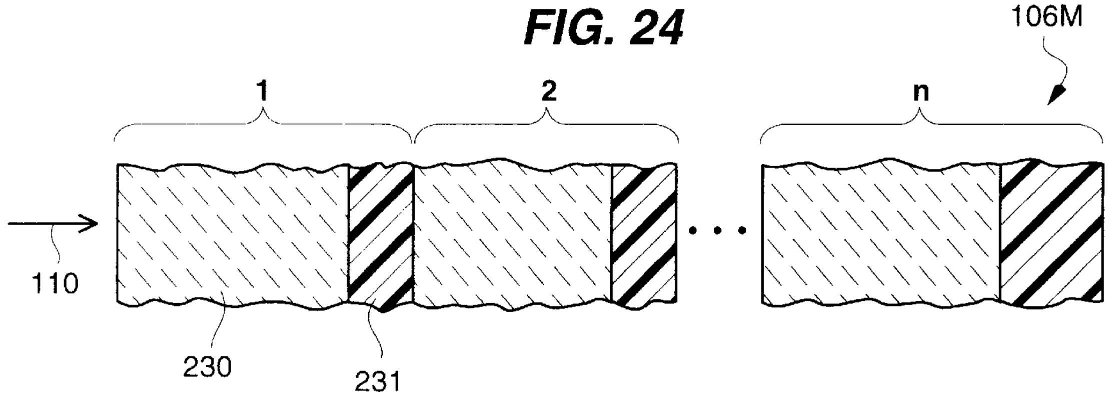
Figure 25:
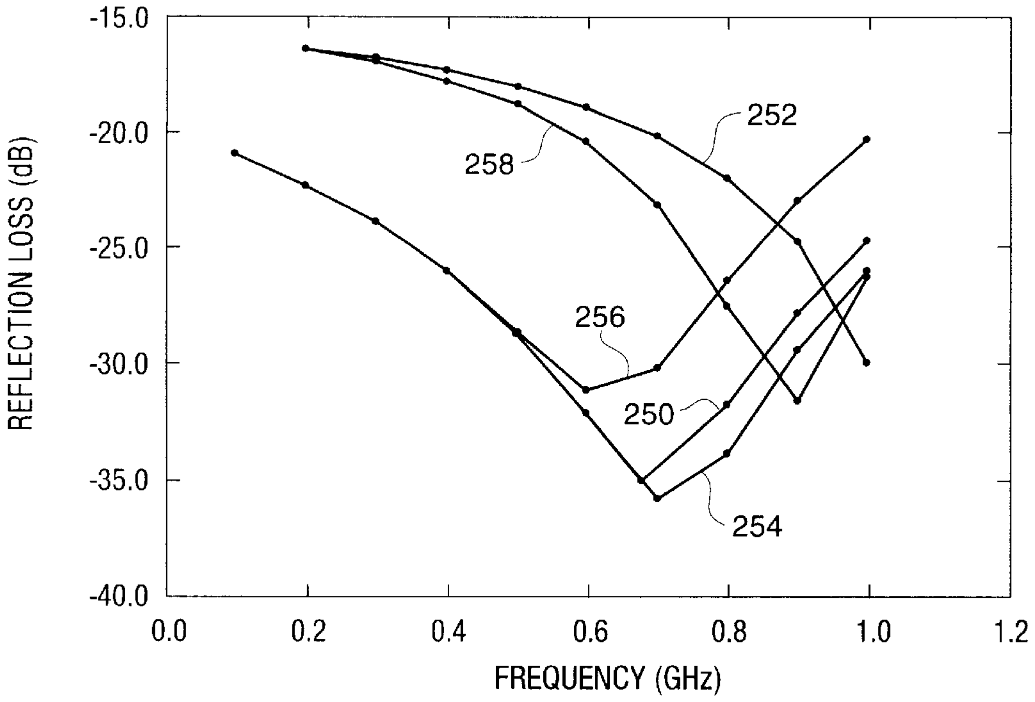
FIG. 25 shows a computer simulated graph of reflective loss versus frequency for various thicknesses of a ferrite/polymer/LSM/high dielectric constant absorber.

FIGS. 22, 23, and 24 show examples of how the teachings of the above layering principals can be extended to many-layered absorbers 106. In the embodiment 106K of FIG. 22, there is one ferrite layer 210 and three dielectric layers 212, 214, and 216. Any of the ferrites discussed above may be used as the ferrite 210, and any of the dielectrics discussed above may be used as the dielectrics, with the understanding that dielectric 214 is different from dielectrics 212 and 216. An example of such an embodiment, is an absorber 106K in which ferrite 210 is $Ni_{0.4}Zn_{0.6}Fe_2O_4$, dielectric 212 is a polymer, dielectric 214 is LSM, and dielectric 216 is BST. A graph of reflective loss in dB versus frequency in GHz as simulated by computer for various thicknesses of the materials is shown in FIG. 25. The thicknesses of the materials is given in Table 7.

TABLE 7

| Curve No. | Ferrite Thickness in mm | Polymer Thickness in mm | LSM Thickness in mm | BST Thickness in mm |
|---|---|---|---|---|
| 250 | 5 | 2 | 2 | 1 |
| 252 | 4 | 2 | 2 | 2 |
| 254 | 5 | 3 | 3 | 1 |
| 256 | 5 | 2 | 2 | 1 |
| 258 | 4 | 2 | 2 | 2 |

The invention contemplates that many more layers of dielectric may be used. Since the dielectric layers are relatively thin, it is relatively easy to form such multilayered panels.

Figure 26:
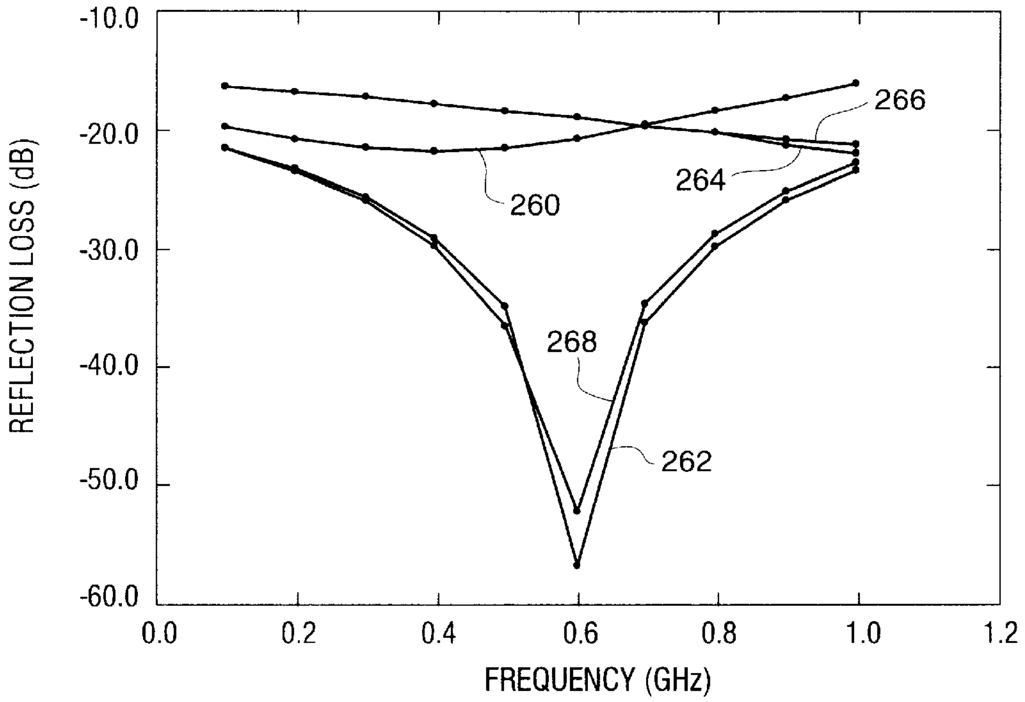
FIG. 26 shows a computer simulated graph of reflective loss versus frequency for various thicknesses of a multilayer ferrite/polymer absorber.

Embodiment 106L of FIG. 23 shows an absorber 106 comprising a layer 220 of ferrite, a layer 222 of polymer, a second layer 224 of ferrite, a second layer 226 of polymer, and a third layer 228 of ferrite. Again, any ferrite or polymer discussed above may be used. FIG. 26 shows a graph of reflective loss in dB versus frequency as computer simulated for an absorber 106L in which the ferrites 220, 224, and 228 were $Ni_{0.4}Zn_{0.6}Fe_2O_4$ and the polymers 222 and 226 was a polycarbonate with the properties shown in Table 5. The thicknesses of each layer for each curve are given in Table 8.

TABLE 8

| Curve No. | 1st Ferrite Thickness | 1st Polymer Thickness | 2nd Ferrite Thickness | 2nd Polymer Thickness | 3rd Ferrite Thickness |
|---|---|---|---|---|---|
| 260 | 2 | 2 | 2 | 2 | 2 |
| 262 | 2 | 2 | 1 | 3 | 2 |
| 264 | 2 | 3 | 1 | 3 | 1 |
| 266 | 1 | 3 | 2 | 3 | 1 |
| 268 | 2 | 3 | 1 | 2 | 2 |

Figure 27:
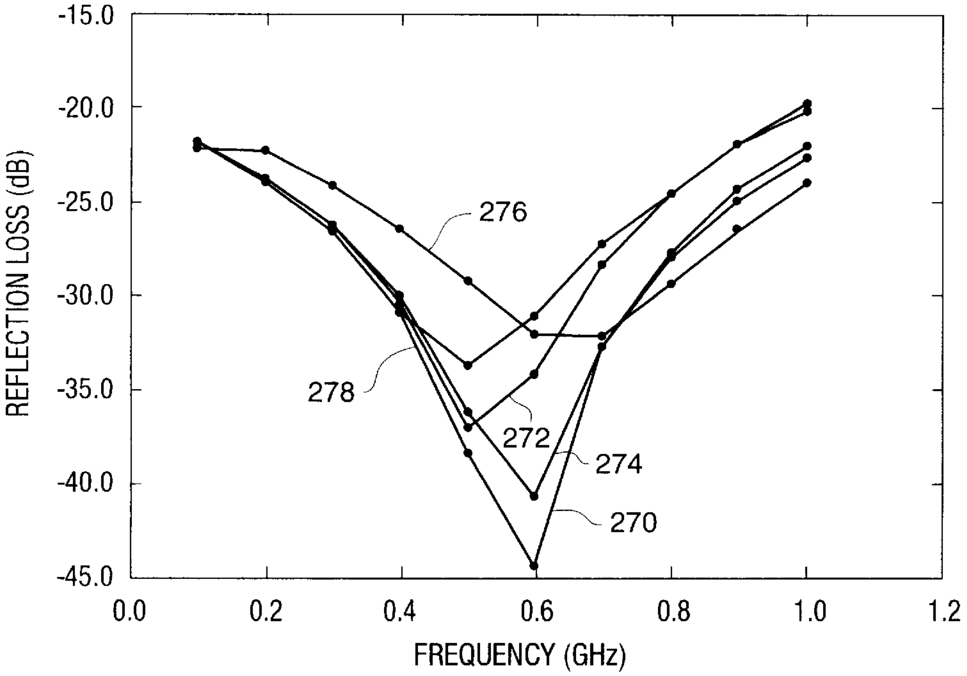
FIG. 27 shows a computer simulated graph of reflective loss versus frequency for an absorber having 50 ferrite/polymer layers for various thicknesses of the ferrite/polymer combination.

Embodiment 106M of FIG. 24 illustrates an absorber 106 comprising n ferrite/polymer layers, where n is greater than 1 and, preferably, 100 or less. That is, the basic absorber element embodiment 106M is a layer of ferrite 230 and a layer of polymer 231. The basic absorber element indicated by the number 1, is repeated n times as shown. The ferrite may be any of the ferrites discussed above, and the polymer may be any of the polymers discussed above. Preferably, the ferrite and the polymer is the same in each absorber element, though the invention contemplates that one or all of the absorber elements 1 through n be made of different materials from the other elements. FIG. 27 shows a graph of reflective loss in dB versus frequency as computer simulated for an absorber 106M in which the ferrites 230 were $Ni_{0.4}Zn_{0.6}Fe_2O_4$, the polymers 231 were a polycarbonate with the properties shown in Table 5, and n=50. The thicknesses of the ferrite 230 and the polymer 231 for the basic absorber element for each curve are given in Table 9.

TABLE 9

| Curve No. | Ferrite Thickness in μm | Polymer Thickness in μm |
|---|---|---|
| 270 | 100 | 100 |
| 272 | 200 | 200 |
| 274 | 100 | 50 |
| 276 | 95 | 100 |
| 278 | 105 | 100 |

Figure 30:
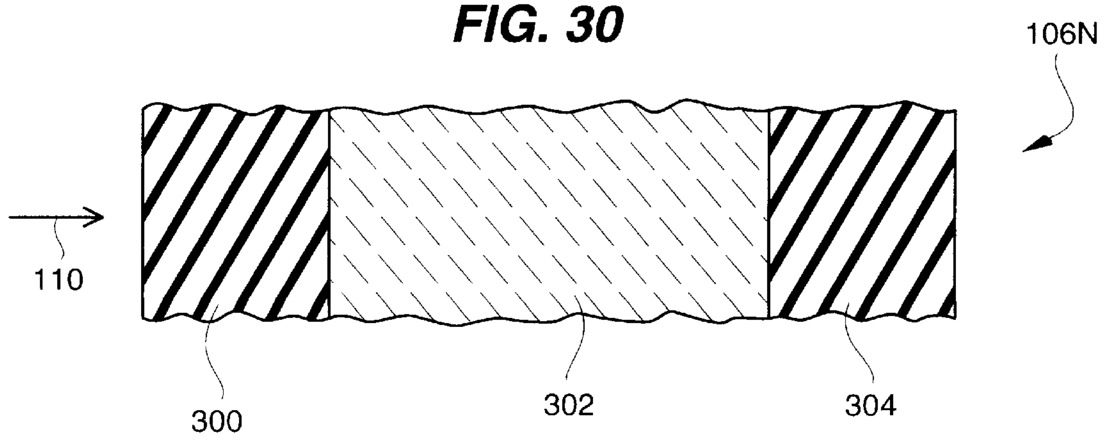
FIG. 30 shows a cross-sectional view of an alternative preferred embodiment of the wave absorbing layer of the panel of FIG. 1.

An analysis of all the results discussed above indicates that perhaps the best absorber 106 is an embodiment 106N shown in FIG. 30. This absorber 106N includes a high $\mu''$ material 302 sandwiched between a high dielectric constant material 300 and a low dielectric constant material 304. Preferably the high dielectric constant material is nearest the side of incidence of the radiation 110 and the low dielectric constant material is nearest to the support structure 100 and the metal reflector 104. Preferably, the imaginary part of the permeability, $\mu''$, of the middle layer 302 is not only high, but it is also higher than the real part of the permeability, $\mu'$. Preferably, the high dielectric constant material has a dielectric constant of 100 or more, and the low dielectric constant material has a dielectric constant of 5 or less.

The above advances in the art are based on empirical results. Generally, it is understood by the inventors that the good results for some materials, such as the ferrites, is due to the high $\mu''$ of these materials. However, it is difficult to find an explanation of many good results obtained, particularly since many of the materials used do not have any readily identifiable property that accounts for the results. A careful analysis has been made of the above-disclosed results and the properties of the materials, and it is now understood that some of the good absorption properties are related to the principal of the quarter-wave plate. In a quarter-wave plate absorber, a thickness of material equal to one-quarter of a wavelength is placed in front of a 100% reflector, such as a metal layer. That is, this absorption principal is effective only for a thickness given by $$t=\lambda_{eff}/4, \quad (1)$$

where $\lambda_{eff}=\lambda/(\epsilon'\mu')^{1/2}$ and $\lambda$ is the wavelength of the incident wave. At first glance, it would not appear that this could apply to the relatively broad absorptions discussed above, since the materials used are much thinner than a quarter of a typical television frequency wavelength, and equation 1 can be true only for an extremely narrow range of wavelengths. However, in high dielectric constant materials, the wavelength of a wave of a given frequency is much shorter than it is in air. Moreover, if for a certain absorber 106 structure, $\epsilon'$ is a function of frequency such that:

$$f=1/(\epsilon'\mu')^{1/2}, \quad (2)$$

where f is the frequency of the wave of wavelength $\lambda$, then the structure will be a good absorber over the entire frequency range for which equation (2) is true. If an absorber structure has an effective $\epsilon'$ that obeys equation (2) over a relatively wide frequency range, that is, if $$(\epsilon'_{eff}\mu'_{eff})^{1/2}\sim 1/f, \text{ or} \quad (3)$$

$$n_{eff}\sim 1/f, \quad (4)$$

where $n_{eff}$ is the effective index of refraction, for a broad range of frequencies, then this structure would be a good absorber. Looking at tables 4 and 5 above, we see that for many of the materials of the invention $\mu'_{eff}=1$ or is very close to one.

Structures made of several of these materials will also have $\mu'_{eff}=1$, or close to it. Structures made of these materials and for which $$(\epsilon'_{eff})^{1/2} 1/f \quad (5)$$

over a specified frequency range will be good absorbers over that frequency range.

From the above, it can be seen that any material or structure that has an effective $\epsilon'\mu'$ that decreases with frequency over a frequency range, or which has an effective dielectric constant that decreases with frequency over a frequency range and has a $\mu'$ that is 1 or approximately 1 over that range, will generally be a good absorber over at least a portion of that range, providing the thickness is near the thickness given by equation (1). That is, the fact that $\epsilon'$ is decreasing with frequency, increases the range over which the quarter wave relation (1) will be approximately true, and thus will increase the range over which the material or structure will make an effective quarter wave plate. The closer that the decline in the effective dielectric constant approaches equation (5) over this range, the broader will be the range over which the structure will make a good absorber. With this in mind, a review of FIGS. 7 and 8 suggests why nickel-zinc ferrite is a good absorber over a broad range of frequencies, particularly when it is combined with a high dielectric constant material.

A further factor that is important in providing good absorption is impedance matching of adjacent layers. That is, that the impedance of adjacent layers should be approximately equal. In terms of the layer closest to the exterior surface of panel 100 this means that the impedance should be 1 or close to 1, since the impedance of air is 1. If the impedance of adjacent layers is very different, then an electromagnetic wave will tend to be reflected at the interface of the two layers, and the inner layer will not participate significantly in the absorption. Impedance is defined as $z=([\mu'-i\mu'']/[\epsilon'-i\epsilon''])^{1/2}$. While this is a complex expression, the behavior of which is difficult to see intuitively, it can be simplified somewhat by realizing that $\epsilon''$ and $\mu''$ are essentially losses, and thus $(\mu'/\epsilon')^{1/2}$ is the principal parameter that needs to be matched. The impedance of air is 1. FIGS. 7 and 8 show that over a significant range of frequencies near 200 MHz, $\mu'\approx\epsilon'$ for $Ni_{0.4}Zn_{0.6}Fe_2O_4$, and thus $(\mu'/\epsilon')^{1/2}$ is close to 1. This fact, when combined with the fact that this ferrite also satisfies the conditions of the previous paragraph, indicates why this material is a good absorber.

From the above, a preferred method of designing an electromagnetic wave absorption panel can be distilled. First a combination of materials is found that has an index of refraction that decreases with frequency and absorbs well over a frequency range in the vicinity of the frequency range desired to be absorbed. Then, the combination is tuned so that its index of refraction more closely approaches the ideal equation (4), which broadens the absorption range. The materials and relative thicknesses of the materials can also be tuned to shift the peak absorption frequency if desired, and to match impedances of adjacent layers as much as possible, and then in an iterative process, the resulting combination can again be tuned to more closely approach equation (4).

It has been found that materials with a decreasing effective dielectric constant in particular are very effective as a front layer, i.e. the layer closer to the incident radiation 110, in improving the wave absorption characteristics of a multilayer absorber system.

Figure 28:
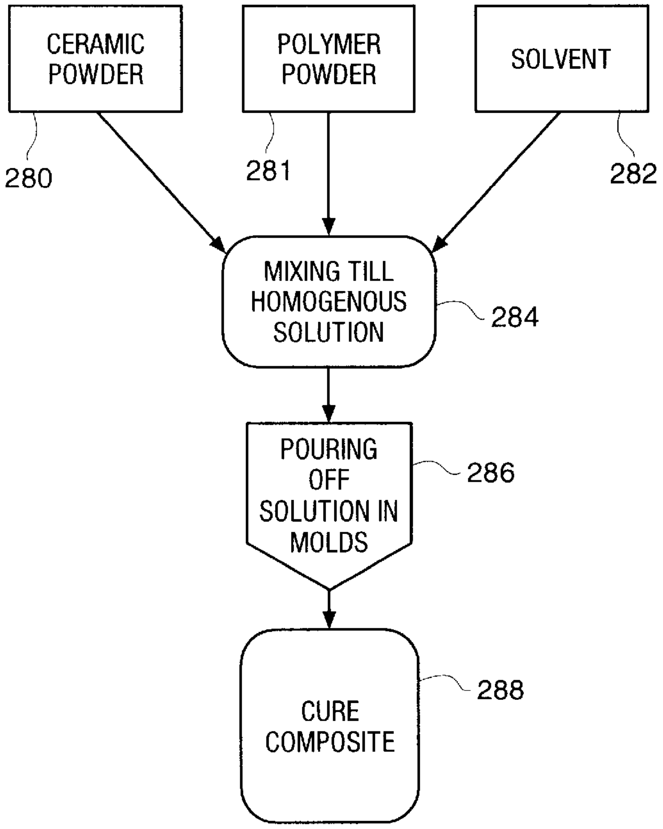
FIG. 28 shows a flow chart of the process of making a polymer-ceramic composite material according to the invention.

In the above discussion, many of the embodiments included a polymer-ceramic composition. A flow chart of the process of making these compositions is shown in FIG. 28. First a powder 280 of the desired ceramic material, a polymer powder 281, and a solvent 282 that will dissolve the polymer are mixed in step 284. For example, if the polymer is Butvar™, then a suitable solvent is tetrahydrofuran (THF). The ceramic is suspended in the solution. The resulting solution is mixed until it is homogeneous, and then poured into a mold in step 286. The composite is then cured at a suitable temperature for a suitable time period. For example, for Butvar™ a suitable temperature is room temperature and a suitable time period is twelve hours.

From the above it can be seen that the polymer-ceramic composites have several advantages over conventional absorbers. They are not only light weight, but they can be easily fabricated at room temperature. They permit ease of combination of several materials with different properties, such as a ferroelectric and a ferrite, or a high dielectric constant material and a ferrite, permitting the tuning of a material for a specific reflectivity problem. Moreover, the resulting absorber 106 is relatively flexible, making handling and general construction easier.

Figure 29:
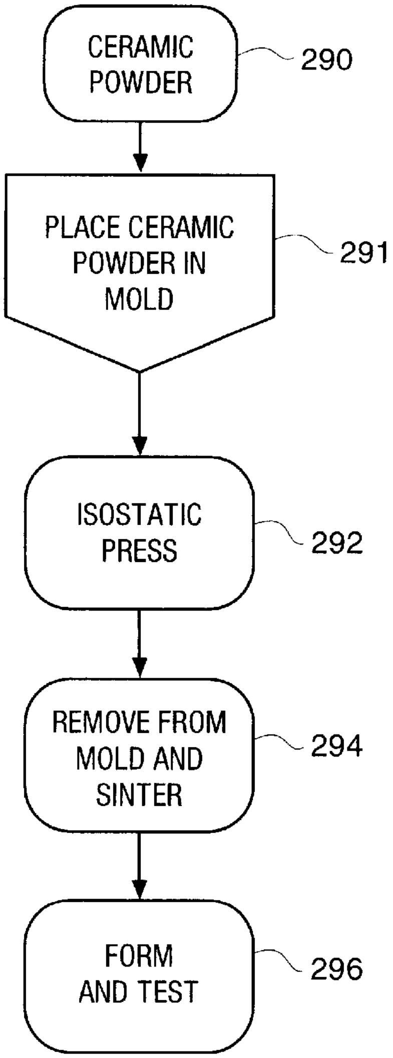
FIG. 29 shows a flow chart of the process of making a ceramic material according to the invention.

Many of the dielectrics, ferroelectrics, ferrites, etc. used in the absorbers 106 according to the invention are ceramics. All of these ceramics were made by the process illustrated in the flow chart of FIG. 29. In step 291 a powder 290 of the ceramic material desired is placed inside a mold. Preferably the mold is made of stainless steel. In step 292 the powder is isostatically pressed in the mold, preferably at a pressure of 50,000 pounds per square inch (PSI). Then, in step 296, the ceramic is removed from the mold and sintered, preferably at a temperature of between 900° C. and 1100° C. The sample was then further formed, if necessary, and then tested. If the test is a dielectric test, the disk-shaped sample as removed from the mold was suitable. For the magnetic tests, a hole was drilled in the samples to form them in a donut shape prior to testing.

A feature of the invention is that many of the layered absorbers according to the invention are much less bulky and less heavy than prior art absorbers. For example, the preferred thicknesses of the high dielectric constant materials mentioned above are two to ten times thinner than the preferred thicknesses of prior art ferrites according to the invention. Moreover, many of the high dielectric constant materials, such as BST are hardened ceramics that are weather resistant. Thus, the outer protective tiles 109 can be eliminated or made less thick.

Another feature of the invention is that it has been found that the higher the dielectric constant of the material, the thinner the material may be and still provide good absorption in combination with other materials.

A further feature of the invention is that for the materials and structures of the invention there is a critical thickness, $t_c$, for optimum absorption performance, and generally a range of thicknesses about this critical thickness for which there will be good absorption performance.

Another feature of the invention is that materials that have a dielectric constant, $\epsilon'$, that varies as a function of frequency will make good absorbers, particularly when combined with other materials that broaden the frequency range over which the effective dielectric constant of the materials follows the formula (3).

A further feature of the invention is that virtually all of the embodiments of the invention can be relatively easily tuned to a particular frequency within the television and higher frequency radio wavelengths. This can be done either by varying the components of each embodiment, varying the thickness of each component, or, when a composite or solid solution is involved, varying the amount of each component, or several of the foregoing. Thus, the absorber panels of the invention lend themselves to the solution of specific electromagnetic environment problems for specific construction sites.

Another feature of the invention is that the nickel-zinc ferrite is the best of the ferrites in absorption and the $Ni_{0.4}Zn_{0.6}Fe_2O_4$ stoichiometry of this material is the most preferred. Several different stoichiometric formulations have been discussed above. The nickel-zinc ferrite may also be doped, such as with magnesium or other metal, but the undoped ferrite has been found to be best in the television frequency range.

A further feature of the invention is that even though low dielectric constant materials are not good absorbers in the MHz frequency range, when used as a sandwich layer between a ferrite and a metal, they significantly improve the overall absorption performance of the wave absorption panel system.

Although there have been described what are at present considered to be the preferred embodiments of the invention, it will be understood that the invention can be embodied in other specific forms without departing from its spirit or essential characteristics. Now that the advantage of using the multi-layered absorbers of the invention have been shown, many modifications and variations of these absorbers may be devised. The present embodiments are, therefore, to be considered as illustrative and not restrictive. The scope of the invention is indicated by the appended claims.

We claim:

1. An electromagnetic wave absorption panel for absorbing waves incident on said panel at a point of incidence, said panel comprising:

a building support element;

a reflective element supported by said support element; and a plurality of absorber elements supported by said support element, said absorber elements located closer to said point of incidence of said electromagnetic wave on said panel than said reflective element, said absorber elements stacked in a direction perpendicular to said reflective element and all of said absorber elements being on the same side of said reflective element with respect to said point of incidence, and each of said absorber elements comprising a first layer comprising a ferrite and a second layer comprising a low dielectric constant material, said second layer being different from said first layer in composition and at least one physical property that can affect an electromagnetic wave, and in each of said absorber elements said second layer located farther from said point of incidence of said electromagnetic wave than said first layer.

2. An electromagnetic wave absorption panel as in claim 1 wherein there are n of said absorber elements, where n is an integer between 2 and 100.

3. An electromagnetic wave absorption panel as in claim 1 wherein said low dielectric constant material comprises a polymer.

4. An electromagnetic wave absorption panel as in claim 1 wherein said ferrite comprises $Ni_{0.4}Zn_{0.6}Fe_2O_4$.

5. An electromagnetic wave absorption panel for absorbing waves incident on said panel at a point of incidence, said panel comprising:

a building support element;

a reflective element supported by said support element; and an absorber element supported by said support element, said absorber element located closer to said point of incidence of said electromagnetic wave on said panel than said reflective element, said absorber element comprising a first layer comprising a ferrite, a second layer comprising a low dielectric constant material, and a third layer comprising a high dielectric constant material, said first, second, and third layers all being on the same side of said reflective element with respect to said point of incidence, said second layer being different from said first layer in composition and at least one physical property that can affect an electromagnetic wave, said third layer being different from said first layer and said second layer in composition and at least one physical property that can affect an electromagnetic wave, and said second layer located farther from said point of incidence of said electromagnetic wave than said first layer.

6. An electromagnetic wave absorption panel as in claim 5 wherein said third layer is located closer to said point of incidence than said first layer.

7. An electromagnetic wave absorption panel as in claim 6 wherein said ferrite comprises $Ni_{0.4}Zn_{0.6}Fe_2O_4$ and said low dielectric constant material comprises a polymer.

8. An electromagnetic wave absorption panel as in claim 6 wherein said high dielectric constant material comprises a 50/50 solid solution of $BaTiO_3$ and $BaO.6Fe_2O_3$, said ferrite comprises $Ni_{0.4}Zn_{0.6}Fe_2O_4$, and said low dielectric constant material comprises polytetrafluoroethylene.

9. An electromagnetic wave absorption panel as in claim 6 wherein said ferrite comprises $Ni_{0.4}Zn_{0.6}Fe_2O_4$, said low dielectric constant material comprises polycarbonate, and said high dielectric constant material comprises $Ba_{0.7}Sr_{0.3}TiO_3$.

10. An electromagnetic wave absorption panel as in claim 6 wherein said ferrite comprises $Ni_{0.4}Zn_{0.6}Fe_2O_4$ and said low dielectric constant material comprises polycarbonate.

11. An electromagnetic wave absorption panel as in claim 5 wherein said high dielectric constant material comprises a material selected from the group consisting of layered superlattice materials, $ABO_3$-type perovskites, signet magnetics, and $Z \times BaTiO_3 + (100\% - Z) \times BiFeO_3$ where $100\% > Z > 0\%$.

12. An electromagnetic wave absorption panel as in claim 11 wherein said high dielectric constant material comprises BST having the formula $Ba_{0.7}Sr_{0.3}TiO_3$.

13. An electromagnetic wave absorption panel as in claim 5 wherein said third layer is located farther from said point of incidence than said second layer.

14. An electromagnetic wave absorption panel as in claim 13 wherein said high dielectric constant material comprises a material selected from the group consisting of layered superlattice materials, $ABO_3$-type perovskites, signet magnetics, and $Z \times BaTiO_3 + (100\% - Z) \times BiFeO_3$ where $100\% > Z > 0\%$.

15. An electromagnetic wave absorption panel as in claim 14 wherein said high dielectric constant material comprises BST having the formula $Ba_{0.7}Sr_{0.3}TiO_3$.

16. An electromagnetic wave absorption panel as in claim 13 wherein said ferrite comprises $Ni_{0.4}Zn_{0.6}Fe_2O_4$ and said low dielectric constant material comprises a polymer.

17. An electromagnetic wave absorption panel as in claim 13 wherein said ferrite comprises $Ni_{0.4}Zn_{0.6}Fe_2O_4$, said low dielectric constant material comprises polycarbonate, and said high dielectric constant material comprises $Ba_{0.7}Sr_{0.3}TiO_3$.

18. An electromagnetic wave absorption panel as in claim 13 wherein said ferrite comprises $Ni_{0.4}Zn_{0.6}Fe_2O_4$ and said low dielectric constant material comprises polycarbonate.

19. An electromagnetic wave absorption panel as in claim 13 wherein said high dielectric constant material comprises a 50/50 solid solution of $BaTiO_3$ and $BaO.6Fe_2O_3$, said ferrite comprises $Ni_{0.4}Zn_{0.6}Fe_2O_4$, and said low dielectric constant material comprises polytetrafluoroethylene.

* * * * *